US012604607B2

(12) United States Patent
Kwon et al.

(10) Patent No.: US 12,604,607 B2
(45) Date of Patent: Apr. 14, 2026

(54) DISPLAY DEVICE

(71) Applicant: LG Display Co., Ltd., Seoul (KR)

(72) Inventors: Hoiyong Kwon, Seoul (KR); Jihun Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 829 days.

(21) Appl. No.: 17/961,548

(22) Filed: Oct. 6, 2022

(65) Prior Publication Data

US 2023/0121603 A1     Apr. 20, 2023

(30) Foreign Application Priority Data

Oct. 19, 2021     (KR) ........................ 10-2021-0139772

(51) Int. Cl.
*H10K 50/844*          (2023.01)
*H01L 23/00*           (2006.01)
(Continued)

(52) U.S. Cl.
CPC .......... *H10K 50/844* (2023.02); *H01L 24/05* (2013.01); *H01L 24/26* (2013.01); *H01L 24/29* (2013.01); *H01L 24/32* (2013.01); *H01L 24/83* (2013.01); *H10K 59/122* (2023.02); *H10K 59/131* (2023.02); *H10K 71/00* (2023.02); *H01L 2224/05572* (2013.01); *H01L 2224/05573* (2013.01); *H01L 2224/26145* (2013.01); *H01L 2224/29021* (2013.01);
(Continued)

(58) Field of Classification Search
CPC ................................................. H10K 50/844
See application file for complete search history.

(56) References Cited

U.S. PATENT DOCUMENTS 7,968,382 B2     6/2011   Jinbo et al.
8,994,060 B2     3/2015   Jinbo et al.
(Continued)

FOREIGN PATENT DOCUMENTS

CN     107039600 A     8/2017
CN     107564918 A     1/2018
(Continued)

OTHER PUBLICATIONS

Taiwan Intellectual Property Office, Office Action, Taiwanese Patent Application No. 113123217, Sep. 5, 2024, 12 pages.
(Continued)

*Primary Examiner* — Douglas M Menz
(74) *Attorney, Agent, or Firm* — Fenwick & West LLP

(57)          ABSTRACT

In order to achieve the above-described objects, according to an aspect of the present disclosure, a display device includes a substrate which includes an active area and a non-active area extending from the active area and including a pad area and is formed of any one of a transparent conducting oxide and an oxide semiconductor; a plurality of inorganic insulating layers disposed on the substrate; a dam member having one end disposed on the pad area and the other end disposed at the outside of the substrate; and a plurality of flexible films which is disposed to cover the dam member and has one end disposed in the pad area. Accordingly, the dam member which covers the pad area is formed to minimize the crack of the plurality of inorganic insulating layers at the edge of the substrate.

23 Claims, 13 Drawing Sheets

(51) Int. Cl.

| | |
|---|---|
| *H10K 59/122* | (2023.01) |
| *H10K 59/131* | (2023.01) |
| *H10K 71/00* | (2023.01) |
| *H10K 59/12* | (2023.01) |
| *H10K 71/80* | (2023.01) |

(52) U.S. Cl.
CPC .............. *H01L 2224/32237* (2013.01); *H01L 2224/83005* (2013.01); *H01L 2224/83007* (2013.01); *H10K 59/1201* (2023.02); *H10K 71/80* (2023.02)

(56) References Cited

U.S. PATENT DOCUMENTS

| | | | |
|---|---|---|---|
| 9,171,895 | B2 | 10/2015 | Nakadaira |
| 9,184,221 | B2 | 11/2015 | Jinbo et al. |
| 9,768,201 | B2 | 9/2017 | Nakamura et al. |
| 9,798,354 | B2 | 10/2017 | Park |
| 9,909,725 | B2 | 3/2018 | Aoyama et al. |
| 10,177,129 | B2 | 1/2019 | Namkung et al. |
| 10,185,363 | B2 | 1/2019 | Hiroki |
| 10,285,278 | B2 | 5/2019 | Namkung et al. |
| 10,312,264 | B2 | 6/2019 | Nakamura et al. |
| 10,396,309 | B2 | 8/2019 | Kim et al. |
| 10,514,137 | B2 | 12/2019 | Aoyama et al. |
| 10,627,866 | B2 | 4/2020 | Hiroki |
| 10,651,162 | B2 | 5/2020 | Namkung et al. |
| 10,770,674 | B2 | 9/2020 | Lee et al. |
| 10,971,696 | B2 | 4/2021 | Kim et al. |
| 11,251,173 | B2 | 2/2022 | Namkung et al. |
| 11,347,270 | B2 | 5/2022 | Hiroki |
| 11,495,653 | B2 | 11/2022 | Kwack et al. |
| 11,644,870 | B2 | 5/2023 | Hiroki |
| 11,765,929 | B2 | 9/2023 | Kim et al. |
| 2009/0004772 | A1 | 1/2009 | Jinbo et al. |
| 2011/0248291 | A1 | 10/2011 | Jinbo et al. |
| 2013/0048991 | A1 | 2/2013 | Nakadaira |
| 2014/0353637 | A1 | 12/2014 | Kawata |
| 2015/0077953 | A1 | 3/2015 | Namkung et al. |
| 2015/0171151 | A1 | 6/2015 | Chae |
| 2015/0233557 | A1 | 8/2015 | Aoyama et al. |
| 2015/0270321 | A1 | 9/2015 | Jinbo et al. |
| 2016/0004275 | A1 | 1/2016 | Park |
| 2016/0157372 | A1 | 6/2016 | Hiroki |
| 2016/0209696 | A1 | 7/2016 | Lee et al. |
| 2017/0023718 | A1* | 1/2017 | Son ...................... G02B 5/3075 |
| 2017/0069664 | A1 | 3/2017 | Nakamura et al. |
| 2017/0155088 | A1 | 6/2017 | Kim et al. |
| 2018/0006004 | A1 | 1/2018 | Namkung et al. |
| 2018/0069025 | A1 | 3/2018 | Nakamura et al. |
| 2018/0172222 | A1 | 6/2018 | Aoyama et al. |
| 2018/0180951 | A1 | 6/2018 | Toyotaka |
| 2019/0115335 | A1 | 4/2019 | Namkung et al. |
| 2019/0138060 | A1 | 5/2019 | Hiroki |
| 2019/0163009 | A1 | 5/2019 | Lee |
| 2019/0165297 | A1 | 5/2019 | Lee et al. |
| 2019/0181378 | A1* | 6/2019 | Song ................. H10K 59/8794 |
| 2020/0108586 | A1 | 4/2020 | Ryu et al. |
| 2020/0152907 | A1* | 5/2020 | Oh ..................... H10K 59/8722 |
| 2020/0203642 | A1 | 6/2020 | Kim et al. |
| 2020/0266183 | A1 | 8/2020 | Namkung et al. |
| 2020/0278721 | A1 | 9/2020 | Hiroki |
| 2021/0020721 | A1 | 1/2021 | Kwack et al. |
| 2021/0167328 | A1 | 6/2021 | Kim et al. |
| 2022/0276676 | A1 | 9/2022 | Hiroki |
| 2022/0352139 | A1 | 11/2022 | Namkung et al. |
| 2023/0297141 | A1 | 9/2023 | Hiroki |

FOREIGN PATENT DOCUMENTS

| | | |
|---|---|---|
| CN | 112234080 A | 1/2021 |
| JP | 2008-211191 A | 9/2008 |
| JP | 2013-045522 A | 3/2013 |
| JP | 2015-166862 A | 9/2015 |
| JP | 2016-110640 A | 6/2016 |
| JP | 2017-054112 A | 3/2017 |
| KR | 10-2014-0080240 A | 6/2014 |
| KR | 10-2014-0098942 A | 8/2014 |
| KR | 10-2016-0005271 A | 1/2016 |
| KR | 10-2018-0051318 A | 5/2018 |
| KR | 10-2020-0078137 A | 7/2020 |
| KR | 10-2021-0066181 A | 6/2021 |
| TW | 201511381 A | 3/2015 |
| TW | 201926758 A | 7/2019 |

OTHER PUBLICATIONS

Taiwan Intellectual Property Office, Office Action, Taiwanese Patent Application No. 113123216, Sep. 6, 2024, eight pages.

Intellectual Property Office of the United Kingdom, Office Action, GB Patent Application No. 2215353.0, Apr. 12, 2023, four pages.

Taiwan Intellectual Property Office, Office Action, Taiwan Patent Application No. 111139670, Nov. 9, 2023, 13 pages.

Korean Intellectual Property Office, Office Action, Korean Patent Application No. 10-2021-0139772, Feb. 27, 2025, 14 pages.

China National Intellectual Property Administration, Office Action, Chinese Patent Application No. 202211291545.3, Jun. 4, 2024, 10 pages.

The Japan Patent Office, Office Action, Japanese Patent Application No. 2022-163643, Oct. 3, 2023, eight pages.

German Patent and Trademark Office, Examination Report, German Patent Application No. 102022127542.6, Jul. 31, 2025, nine pages.

* cited by examiner

DISPLAY DEVICE

CROSS-REFERENCE TO RELATED APPLICATIONS

This application claims the priority of Korean Patent Application No. 10-2021-0139772 filed on Oct. 19, 2021, in the Korean Intellectual Property Office, the disclosure of which is incorporated herein by reference.

BACKGROUND

Field

The present disclosure relates to a display device, and more particularly, to a display device which removes a plastic substrate to improve a reliability of a pad area while improving flexibility.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate so as to be capable of displaying images even though the display device is folded or rolled is getting attention as a next generation display device.

SUMMARY

An object to be achieved by the present disclosure is to provide a display device which uses one of a transparent conducting oxide layer and an oxide semiconductor layer as a substrate, instead of a plastic substrate.

Another object to be achieved by the present disclosure is to provide a display device which minimizes cracks generated in the plurality of inorganic insulating layers in a pad area.

Still another object to be achieved by the present disclosure is to provide a display device in which an uncured portion of a seal member in the pad area is removed.

Still another object to be achieved by the present disclosure is to provide a display device in which scattering of the substrate in the pad area is minimized.

Still another object to be achieved by the present disclosure is to provide a display device in which a temporary substrate attached below the substrate and the substrate are easily separated when the display device is manufactured.

Still another object to be achieved by the present disclosure is to provide a display device in which an Laser Lift-Off (LLO) process failure of the temporary substrate and the substrate due to the seal member which overflows to the outside of the substrate and the conductive adhesive member is minimized when the display device is manufactured.

Still another object to be achieved by the present disclosure is to provide a display device which removes a plastic substrate to simplify a process and reduce a manufacturing cost.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device includes a substrate which includes an active area and a non-active area extending from the active area and including a pad area and is formed of any one of a transparent conducting oxide and an oxide semiconductor; a plurality of inorganic insulating layers disposed on the substrate; a dam member having one end disposed on the pad area and the other end disposed beyond an end of the substrate; and a plurality of flexible films which is disposed to cover the dam member and has one end disposed in the pad area. Accordingly, the dam member which covers the pad area is formed to minimize the crack of the plurality of inorganic insulating layers at the edge of the substrate.

In order to achieve the above-described objects, according to another aspect of the present disclosure, a display device includes: a substrate which includes a plurality of first areas in which a plurality of pads is disposed and a plurality of second areas between the plurality of first areas and is formed of any one of a transparent conducting oxide and an oxide semiconductor; a plurality of inorganic insulating layers disposed between the substrate and the plurality of pads; a dam member which covers an edge of the substrate in the plurality of first areas and the plurality of second areas; a plurality of flexible films which is disposed on the dam member and is electrically connected to the plurality of pads; and a plurality of conductive adhesive members which is disposed between the plurality of pads and the plurality of flexible films, and a part of the dam member is disposed on the substrate and the remaining part of the dam member is disposed beyond an end of the substrate. Accordingly, the dam member which covers the edge of the substrate is formed to support the plurality of inorganic insulating layers located in the pad area.

In still another embodiment of the present disclosure, a display device comprises a substrate formed of either a transparent conducting oxide or an oxide semiconductor, the substrate including an active area and a non-active area extending from the active area and including a pad area; a plurality of inorganic insulating layers disposed on the substrate; a plurality of flexible films disposed in the pad area; a plurality of pads disposed in the pad area; a plurality of conductive adhesive members disposed between the plurality of pads and the plurality of flexible films; and a dam member including at least a first part and a second part, the first part disposed on and extending in a first direction away from at least one of the inorganic insulating layers in the pad area, and the second part extending away from the first part and the pads in a second direction intersecting the first direction.

Other detailed matters of the exemplary embodiments are included in the detailed description and the drawings.

According to the present disclosure, a conductive adhesive member overflows to cover the pad area during the manufacturing of the display device to support a plurality of inorganic insulating layers disposed on the pad area and minimize a crack defect.

According to the present disclosure, a seal member overflows to fully cover a region between the pads during the manufacturing of the display device to support a plurality of inorganic insulating layers in the region between pads and minimize a crack defect.

According to the present disclosure, a dam is formed between the overflowing conductive member and seal member and the temporary substrate to easily separate the substrate from the temporary substrate.

According to the present disclosure, a dam protruding outwardly from the pad area is disposed to support a plurality of flexible films disposed at the outside of the substrate.

According to the present disclosure, an exposed part of the substrate from the seal member and the conductive adhesive member is removed in advance to minimize the substrate scattering defect.

According to the present disclosure, a seal member which fully covers the pad area is formed to minimize the bending or crack defect in the pad area.

According to the present disclosure, the conductive adhesive member overflows to the outside of the substrate more than the seal member so that a defect in which the seal member permeates into an empty space below the plurality of flexible films to be uncured may be minimized.

According to the present disclosure, a tape is formed in an empty space between the plurality of flexible films and the dam to minimize a defect in which the seal member permeates into an empty space below the plurality of flexible films to be uncured.

According to the present disclosure, a thin transparent conducting oxide layer and an oxide semiconductor layer are used as a substrate of the display device to improve a flexibility of the display device.

According to the present disclosure, a transparent conducting oxide layer and an oxide semiconductor layer are used as substrates of the display device to simplify a structure of the display device and reduce a manufacturing cost.

According to the present disclosure, a transparent conducting oxide layer and an oxide semiconductor layer are used as substrates of the display device to reduce the generation of static electricity and improve a display quality.

According to the present disclosure, the substrate of the display device is manufactured by a deposition process in a vacuum environment so that a substrate manufacturing time is shortened and foreign materials formed on the substrate and a defect thereby may be minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
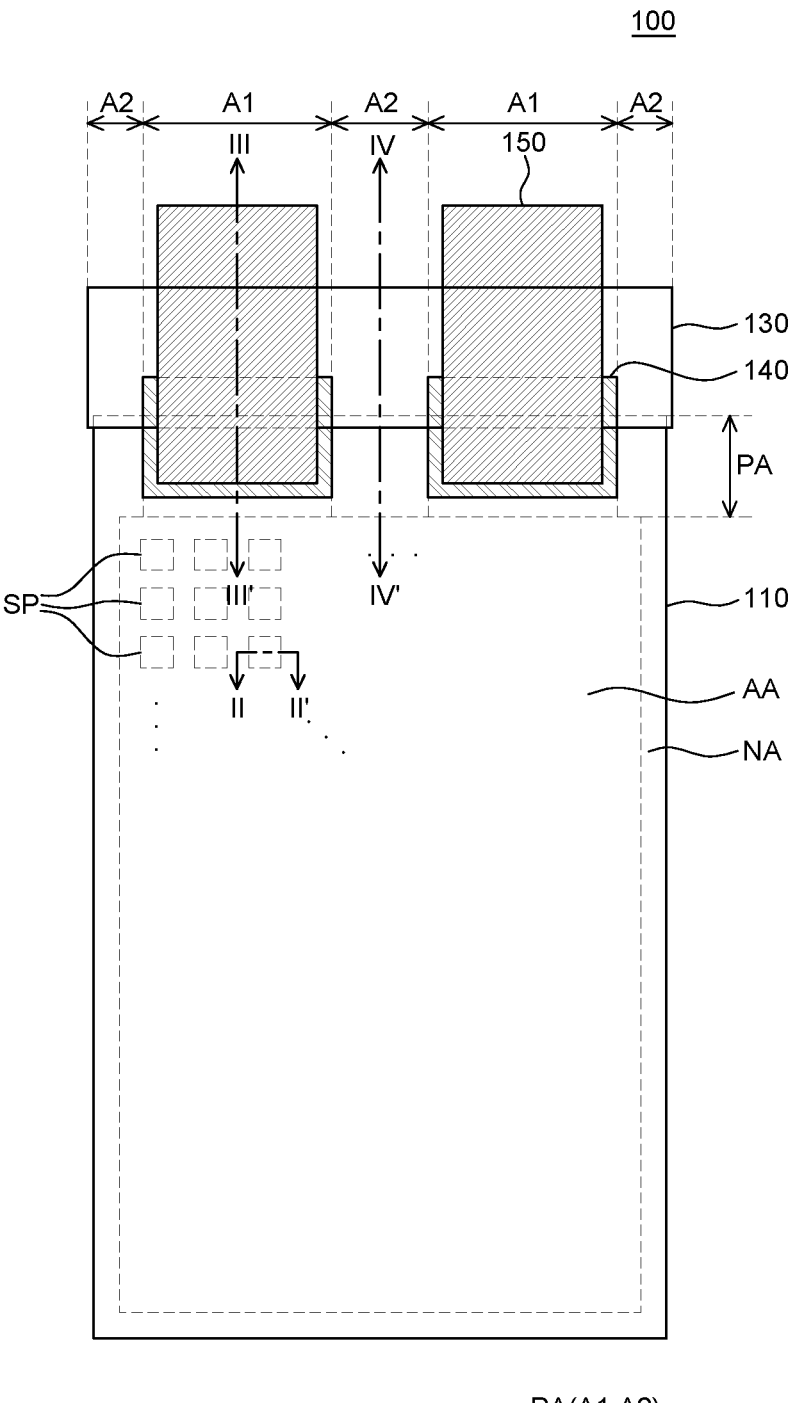
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a plan view of a display device according to an exemplary embodiment of the present disclosure. In FIG. 1, for the convenience of description, among various components of the display device 100, only a substrate 110, a dam member 130, a conductive adhesive member 140, and a plurality of flexible films 150 are illustrated.

Referring to FIG. 1, the substrate 110 is a support member which supports the other components of the display device 100. The substrate 110 may be formed of any one of a transparent conducting oxide and an oxide semiconductor. For example, the substrate 110 may be formed of a transparent conducting oxide (TCO), such as indium tin oxide (ITO), indium zinc oxide (IZO), or indium tin zinc oxide (ITZO).

Further, the substrate 110 may be formed of an oxide semiconductor material formed of indium and gallium (Ga), for example, a transparent oxide semiconductor such as indium gallium zinc oxide (IGZO), indium gallium oxide (IGO), and indium tin zinc oxide (ITZO). However, a type of a material of the transparent conducting oxide and the oxide semiconductor is illustrative so that the substrate 110 may be formed by another transparent conducting oxide and oxide semiconductor material which have not been described in the specification, but is not limited thereto.

In the meantime, the substrate 110 may be formed by depositing the transparent conducting oxide or an oxide semiconductor with a very thin thickness. Therefore, as the substrate 110 is formed to have a very thin thickness, the substrate 110 has a flexibility. A display device 100 including a substrate 110 having a flexibility may be implemented as a flexible display device 100 which displays an image even in a folded or rolled state. For example, when the display device 100 is a foldable display device, the substrate 110 is folded or unfolded with respect to a folding axis. As another example, when the display device 100 is a rollable display device, the display device 100 may be stored by being rolled around the roller. Accordingly, the display device 100 according to the exemplary embodiment of the present disclosure uses a substrate 110 having a flexibility to be implemented as a flexible display device 100 like a foldable display device or a rollable display device.

Further, the display device 100 according to the exemplary embodiment of the present disclosure uses a substrate 110 formed of a transparent conducting oxide or an oxide semiconductor to perform a laser lift off (LLO) process. The LLO process refers to a process of separating a temporary substrate below the substrate 110 from the substrate 110 using laser during the manufacturing process of a display device 100. Accordingly, the substrate 110 is a layer for more easily performing the LLO process so that it is referred to as a functional thin film, a functional thin film layer, or a functional substrate. The LLO process will be described in more detail below.

The substrate 110 includes an active area AA and a non-active area NA.

The active area AA is an area where images are displayed. In the active area AA, a plurality of sub pixels SP may be disposed to display images. For example, the active area AA is configured by a plurality of sub pixels SP including a light emitting diode and a driving circuit to display images.

The non-active area NA is an area where no image is displayed and various wiring lines and driving ICs for driving the sub pixels SP disposed in the active area AA are disposed. For example, in the non-active area NA, various driving ICs such as a gate driver IC and a data driver IC may be disposed. Even though in FIG. 1, it is illustrated that the non-active area NA encloses the active area AA, the non-active area NA may extend from a part of the active area AA, but is not limited thereto.

The non-active area NA includes a pad area PA including a plurality of first areas A1 and a plurality of second area A2. The pad area PA is a non-active area NA in which a plurality of pads are disposed so that the plurality of flexible films 150 are bonded.

The plurality of first areas A1 of the pad area PA are areas in which a plurality of pads are disposed. The plurality of first areas A1 are areas in which the plurality of flexible films 150 are bonded and overlap the plurality of flexible films 150.

The plurality of second areas A1 of the pad area PA are areas between the plurality of first areas A1. The plurality of second areas A2 are areas between the plurality of pads and areas between the plurality of flexible films 150.

In the meantime, even though in FIG. 1, the pad area PA is a non-active area NA corresponding to one side of the active area AA, the number of pad areas PA and a position thereof may vary depending on the design so that it is not limited thereto.

The plurality of flexible films 150 are disposed on the substrate 110. One end of the plurality of flexible films 150 are bonded onto the plurality of pads disposed in the pad area PA of the substrate 110. The plurality of flexible films 150 are films in which various components are disposed on a base film having malleability to supply a signal to the active area AA. One end of the plurality of flexible films 150 is disposed in the non-active area NA of the substrate 110 to supply a data voltage to the active area AA. In the meantime, even though it is illustrated that the plurality of flexible films 150 are two in the drawing, the number of the plurality of flexible films 150 may vary depending on the design, but is not limited thereto.

In the meantime, a driving IC such as a gate driver IC or a data driver IC may be disposed on the plurality of flexible films 150. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 150 by a chip on film manner, but is not limited thereto.

A conductive adhesive member 140 is disposed between the plurality of flexible films 150 and the substrate 110. The plurality of flexible films 150 and the plurality of pads may be electrically connected to each other by means of the conductive adhesive member 140. The conductive adhesive member 140 may be a conductive adhesive layer and for example, may be an anisotropic conductive film (ACF), but is not limited thereto.

At this time, the conductive adhesive member 140 overflows outwardly from the substrate 110 so that a part thereof is disposed on a dam member 130. One end of the conductive adhesive member 140 covers a plurality of first areas A1 and the other end covers a part of a dam member 130 disposed at the outside of the substrate 110. The conductive adhesive member 140 overflows outwardly from the substrate 110 to cover a part of the dam member 130 disposed at the outside of the substrate 110.

The dam member 130 is disposed below the plurality of flexible films 150. One end of the dam member 130 is disposed on the pad area PA of the substrate 110 and the other end is disposed at the outside of the substrate 110 to support parts of the plurality of flexible films 150 and the conductive adhesive member 140. The dam member 130 minimizes the overflowing seal member 160 from penetrating below the plurality of flexible films 150 to be uncured to suppress the crack of a plurality of inorganic insulating layers disposed on the pad area PA during the manufacturing process of the display device 100. This will be described below with reference to FIGS. 5A to 5G.

In the meantime, in the display device 100 according to the exemplary embodiment of the present disclosure, an insulating layer which supports the plurality of flexible films 150 and the conductive adhesive member 140 is referred to as a dam member 130. However, the dam member 130 may be referred to as a first dam, but is not limited thereto.

Figure 2:
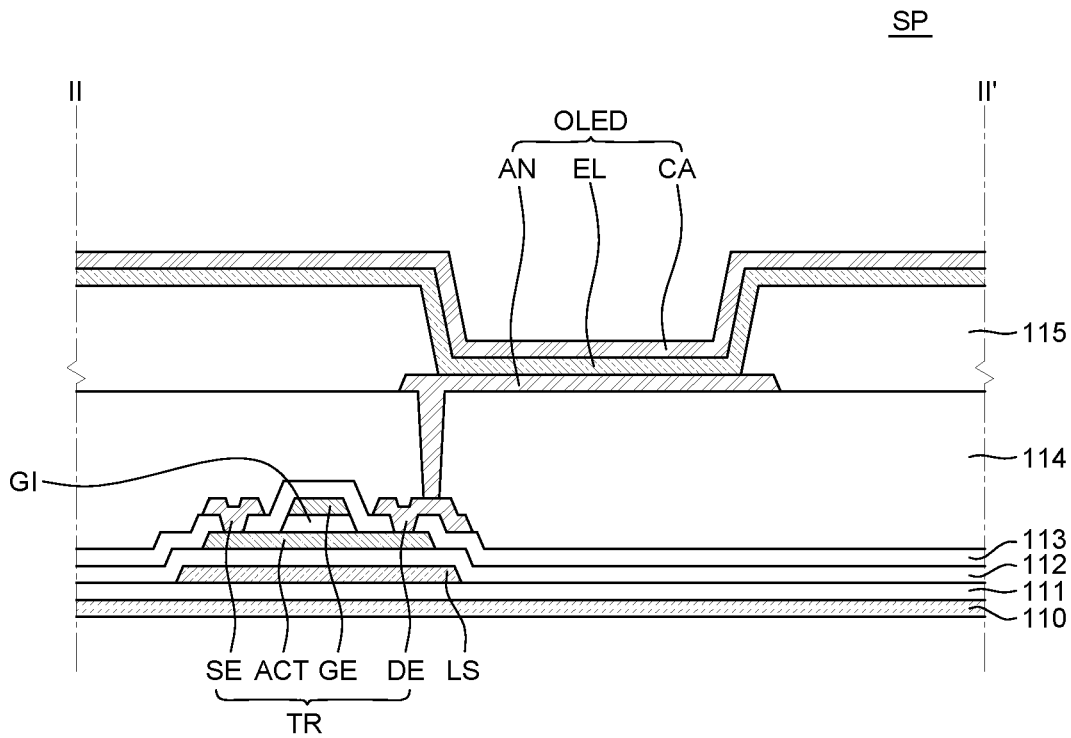
FIG. 2 is a cross-sectional view of a sub pixel of a display device according to an exemplary embodiment of the present disclosure.
Figure 3:
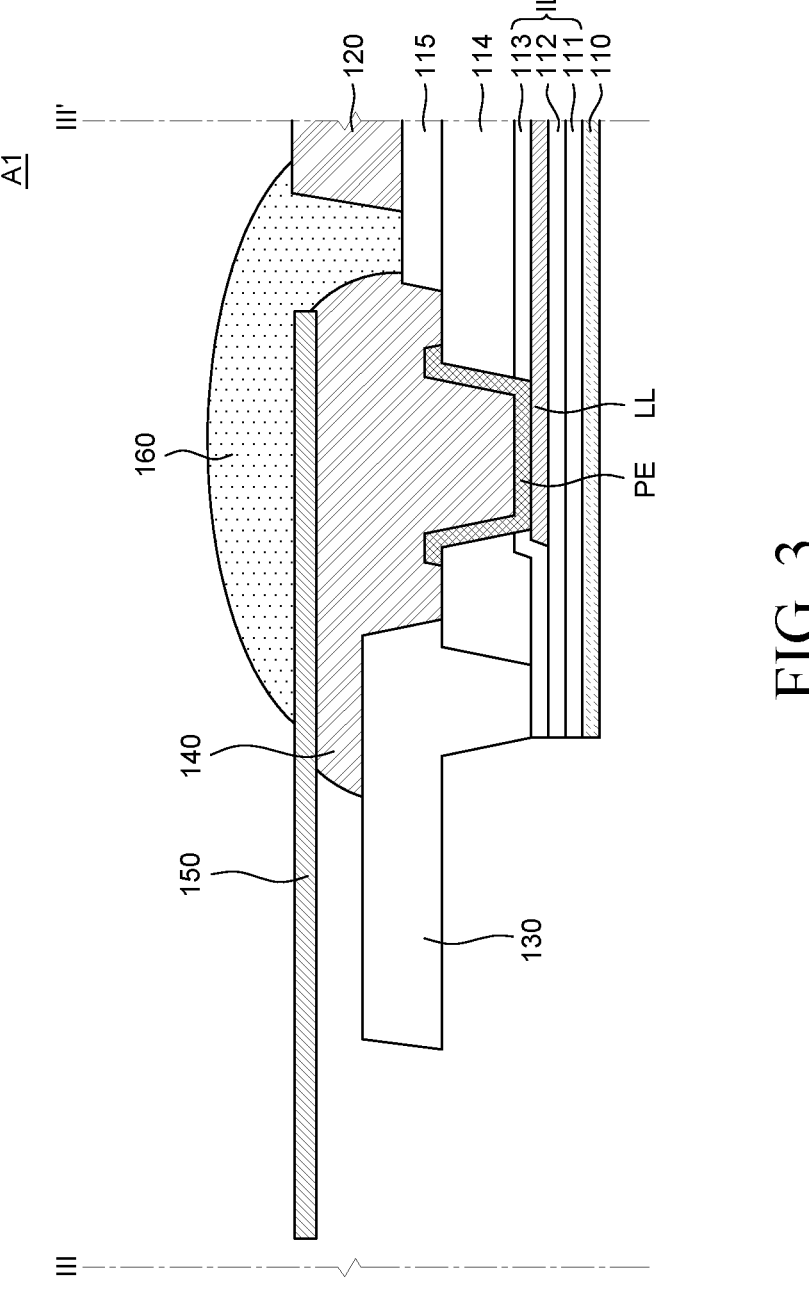
FIG. 3 is a cross-sectional view taken along the line III-III' of FIG. 1.
Figure 4:
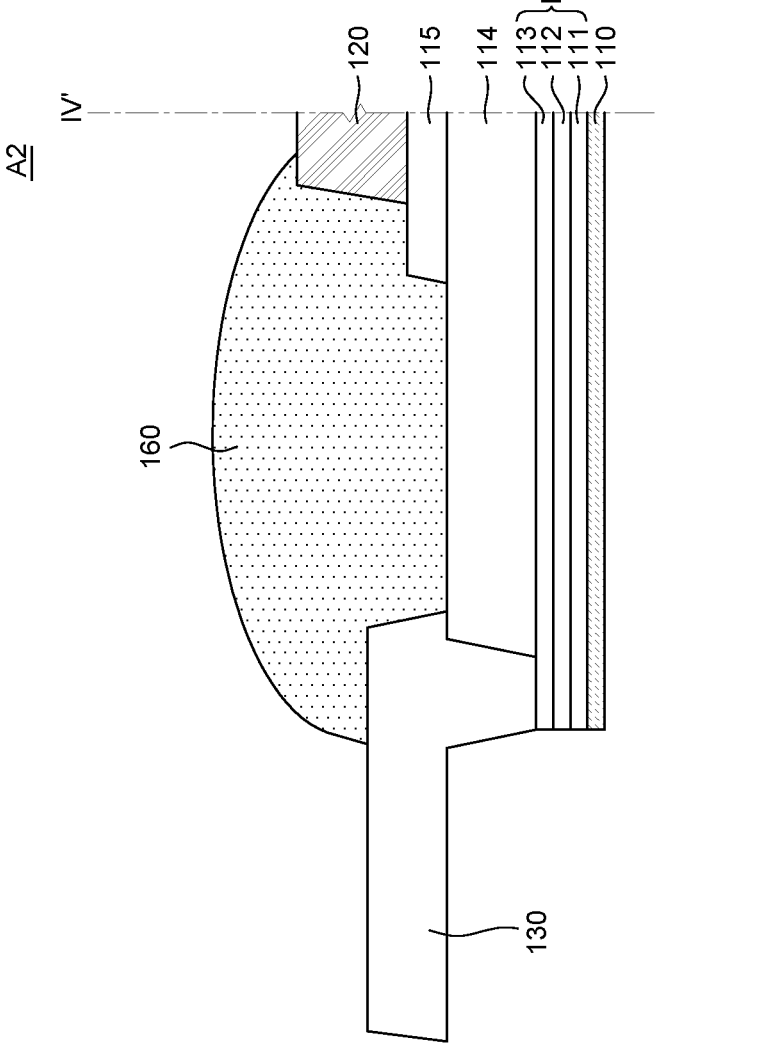
FIG. 4 is a cross-sectional view taken along IV-IV' of FIG. 1.

FIG. 2 is a cross-sectional view of a sub pixel of a display device according to an exemplary embodiment of the present disclosure. FIG. 3 is a cross-sectional view taken along the line III-III' of FIG. 1. FIG. 4 is a cross-sectional view taken along IV-IV' of FIG. 1. For the convenience of description, in FIG. 2, an encapsulation unit 120 is omitted. Referring to FIGS. 2 to 4, the display device 100 according to the exemplary embodiment of the present disclosure includes a substrate 110, a plurality of inorganic insulating layers IL, a gate insulating layer GI, a planarization layer 114, a bank 115, a transistor TR, a light emitting diode OLED, a link line LL, a pad PE, an encapsulation unit 120, a dam member 130, a conductive adhesive member 140, a flexible film 150, and a seal member 160.

Referring to FIGS. 2 and 3, the plurality of inorganic insulating layers IL are disposed on the substrate 110. The plurality of inorganic insulating layers IL includes a first inorganic insulating layer 111, a second inorganic insulating layer 112, and a third inorganic insulating layer 113.

The first inorganic insulating layer 111 is disposed on the substrate 111. The first inorganic insulating layer 111 suppresses moisture and/or oxygen which penetrates from the outside of the substrate 110 from being spread. The moisture permeation characteristic of the display device 100 may be controlled by controlling a thickness or a lamination structure of the first inorganic insulating layer 111. Further, the first inorganic insulating layer 111 may suppress a short circuit problem caused when the substrate 110 formed of a transparent conducting oxide or an oxide semiconductor is in contact with a transistor TR or various wiring lines. The first inorganic insulating layer 111 may be formed of an inorganic material, for example, may be configured by a single layer or a double layer of silicon oxide (SiOx) or silicon nitride (SiNx), but is not limited thereto.

The second inorganic insulating layer 112 is disposed on the first inorganic insulating layer 111. The second inorganic insulating layer 112 may reduce permeation of moisture or impurities through the substrate 110. In this case, the second inorganic insulating layer 112 may be referred to as a buffer layer. For example, the second inorganic insulating layer 112 may be configured by a single layer or a double layer of silicon oxide SiOx or silicon nitride SiNx, but is not limited thereto. Further, the second inorganic insulating layer 112 may be omitted depending on a type of the substrate 110 or a configuration of the sub pixel SP, but is not limited thereto.

A third inorganic insulating layer 113 is disposed on the second inorganic insulating layer 112. The third inorganic insulating layer 113 may be disposed to insulate a plurality of configurations disposed in the active area AA. For example, in the active area AA, a plurality of transistors TR may be disposed and the third inorganic insulating layer 113 may be disposed to insulate the gate electrode GE of the plurality of transistors TR from the active layer ACT or insulate the gate electrode GE from the source electrode SE and the drain electrode DE. Further, the third inorganic insulating layer 113 is disposed to insulate a plurality of wiring lines from various electrodes. In this case, the third inorganic insulating layer 113 may be referred to as an interlayer insulating layer or a passivation layer. For example, the third inorganic insulating layer 113 may be configured by a single layer or a double layer of silicon oxide SiOx or silicon nitride SiNx, but is not limited thereto.

In the meantime, in this specification, it is described that the plurality of inorganic insulating layers IL includes the first inorganic insulating layer 111, the second inorganic insulating layer 112, and the third inorganic insulating layer 113. However, the plurality of inorganic insulating layers IL may further include an inorganic insulating layer disposed between the transistor TR and the planarization layer 114 in addition to the first inorganic insulating layer 111, the second inorganic insulating layer 112, and the third inorganic insulating layer 113. However, it is not limited thereto.

A light shielding layer LS is disposed on the first inorganic insulating layer 111. The light shielding layer LS is disposed so as to overlap the active layer ACT of the transistor TR to block light incident onto the active layer ACT. If light is irradiated onto the active layer ACT, leakage current is generated, which deteriorates the reliability of the transistor TR. At this time, if the light shielding layer LS configured by an opaque conductive material such as copper (Cu), aluminum (Al), molybdenum (Mo), nickel (Ni), titanium (Ti), chrome (Cr), or an alloy thereof is disposed so as to overlap the active layer ACT, light incident from the lower portion of the substrate 110 onto the active layer ACT may be blocked. Accordingly, the reliability of the transistor TR may be improved. However, the light shielding layer LS may be omitted depending on a type of transistor TR, but is not limited thereto. Further, even though the light shielding layer is LS illustrated as a single layer, the light shielding layer LS may be formed as a plurality of light shielding layers LS which overlaps with the plurality of inorganic insulating layers IL therebetween.

The transistor TR is disposed on the second inorganic insulating layer 112. The transistor TR disposed in each of the plurality of sub pixels SP may be used as a driving element of the display device 100. For example, the transistor TR may be a thin film transistor (TFT), an N-channel metal oxide semiconductor (NMOS) transistor, a P-channel metal oxide semiconductor (PMOS) transistor, a complementary metal oxide semiconductor (CMOS) transistor, or a field effect transistor FET, but is not limited thereto. Hereinafter, the plurality of transistors TR are assumed as thin film transistors, but are not limited thereto.

The transistor TR includes an active layer ACT, a gate electrode GE, a source electrode SE, and a drain electrode DE.

First, the active layer ACT is disposed on the second inorganic insulating layer 112. The active layer ACT may be formed of a semiconductor material such as an oxide semiconductor, amorphous silicon, or polysilicon, but is not limited thereto.

The gate insulating layer GI and the gate electrode GE are disposed on the active layer ACT. The gate insulating layer GI is an insulating layer for insulating the gate electrode GE from the active layer ACT and may be formed of an insulating material. For example, the gate insulating layer GI may be configured by a single layer or a double layer of silicon oxide SiOx or silicon nitride SiNx, but is not limited thereto.

In the meantime, even though in FIG. 2, it is illustrated that the gate insulating layer GI is disposed only below the gate electrode GE, the gate insulating layer GI may be disposed on the entire surface of the substrate 110 like the plurality of inorganic insulating layers IL, but is not limited thereto.

The gate electrode GE is disposed on the gate insulating layer GI. The gate electrode GE may be configured by a conductive material such as copper (Cu), aluminum (Al), molybdenum (Mo), nickel (Ni), titanium (Ti), chrome (Cr), or an alloy thereof, but is not limited thereto.

The third inorganic insulating layer 113 is disposed on the gate electrode GE and the active layer ACT. The source electrode SE and the drain electrode DE are disposed on the third inorganic insulating layer 113. The source electrode SE and the drain electrode DE are electrically connected to the active layer ACT through a contact hole formed in the third inorganic insulating layer 113. The source electrode SE and the drain electrode DE may be configured by copper (Cu), aluminum (Al), molybdenum (Mo), nickel (Ni), titanium (Ti), chrome (Cr), or an alloy thereof, but are not limited thereto.

In the present specification, it is described that the transistor TR has a structure in which the gate electrode GE is disposed on the active layer ACT and the source electrode SE and the drain electrode DE are disposed on the gate electrode GE. However, the gate electrode GE, the source electrode SE, and the drain electrode DE may be formed of the same material and the structure of the transistor TR is not limited thereto.

The planarization layer 114 is disposed on the transistor TR. The planarization layer 114 may planarize an upper portion of the substrate 110 including the transistor TR. The planarization layer 114 may be disposed in the entire active area AA and a part of the non-active area NA. The planarization layer 114 may be formed of an organic material, and for example, may be formed by a single layer or a double layer of an acrylic organic material, but is not limited thereto.

The light emitting diode OLED is disposed on the planarization layer 114. The light emitting diode OLED is a self-emitting element which emits light and is disposed in the plurality of sub pixels SP to be driven by the transistor TR. The light emitting diode OLED includes an anode AN, a light emitting layer EL, and a cathode CA.

The anode AN may supply holes to the light emitting layer EL and may be formed of a conductive material having a high work function. For example, when the display device 100 is a bottom emission type in which light emitted from the light emitting diode OLED is emitted below the light emitting diode OLED, the anode AN may be formed of tin oxide (TO), indium tin oxide (ITO), indium zinc oxide (IZO), or indium zinc tin oxide (ITZO), but is not limited thereto. Further, when the display device 100 is a top emission type in which the light emitted from the light emitting diode OLED is emitted above the light emitting diode OLED, the anode AN may further include a reflective layer.

The bank 115 is disposed on the anode AN. The bank 115 is disposed to cover an edge of the anode AN in the active area AA. The bank 115 is disposed at the boundary between the sub pixels SP which are adjacent to each other to reduce the color mixture of light emitted from the light emitting diode OLED of each of the plurality of sub pixels SP. The bank 115 may be formed of an insulating material, and for example, formed of polyimide, but is not limited thereto.

The light emitting layer EL is disposed on the anode AN exposed from the bank 115. The light emitting layer EL is supplied with the holes from the anode AN and supplied with electrons from the cathode CA to emit light. The light emitting layer EL emits red light, green light, blue light, or white light depending on a type and when the light emitting layer emits white light, color filters having various colors may be disposed together.

The cathode CA is disposed on the light emitting layer EL. The cathode CA may be disposed at least on the entire surface of the active area AA. The cathode CA may supply electrons to the light emitting layer EL and may be formed of a conductive material having a low work function. For example, in the case of a top emission type, the cathode CA may be formed of a transparent conducting material such as indium tin oxide (ITO), indium zinc oxide (IZO) or an ytterbium (Yb) alloy. Further, in the case of a bottom emission type, the cathode CA may be formed of any one or more selected from a group consisting of metals such as magnesium (Mg), silver (Ag), and aluminum (Al), and an alloy thereof, but is not limited thereto.

Referring to FIG. 3, an encapsulation unit 120 is disposed on the bank 115. The encapsulation unit 120 is disposed so as to cover the active area AA in which the light emitting diode OLED is disposed to protect the light emitting diode OLED from external moisture, oxygen, or shocks. The encapsulation unit 120 may be configured in various manners.

For example, the encapsulation unit 120 may be configured by thin film encapsulation (TFE) formed by alternately laminating a plurality of inorganic layer and a plurality of organic layers. The inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto.

Further, the encapsulation unit 120 may be configured by a face seal type. For example, the encapsulation unit 120 may be formed by forming an ultraviolet or thermosetting sealant on the entire surface of the active area AA.

The encapsulation unit 120 may be configured in the form of a substrate formed of a metal material. For example, the encapsulation unit 120 may be formed of a material having a high modulus of approximately 200 to 900 MPa. The encapsulation unit may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation unit 120 is formed of a metal material, the encapsulation unit 120 may be implemented as an ultra-thin film and provide a strong resistance against external shocks and scratches.

The encapsulation unit 120 may be configured by combining thin film encapsulation, face seal, and the thin film substrate and may be formed by various methods and materials other than the above-described structure so that it is not limited thereto.

Referring to FIG. 3, a link line LL is disposed between the second inorganic insulating layer 112 and the third inorganic insulating layer 113 in the pad area PA of the non-active area NA. The link line LL is a wiring line which connects the plurality of pads PE and the active area AA. A various signals applied to the pad PE may be transmitted to the plurality of sub pixels SP of the active area AA by means of the link line LL. However, the link line LL may be disposed between the first inorganic insulating layer 111 and the second inorganic insulating layer 112 or on the third inorganic insulating layer 113, but is not limited thereto.

The plurality of pads PE is disposed on the link line LL. The plurality of pads PE is an electrode which is electrically connected to the plurality of flexible films 150 to transmit a signal from the plurality of flexible films 150 to the active area AA. The plurality of pads PE is connected to the link line LL through the contact hole formed in the planarization layer 114 and the third inorganic insulating layer 113.

The conductive adhesive member 140 is disposed on the plurality of pads PE. The conductive adhesive member 140 may be disposed to fill an empty space between the dam member 130 and the bank 115. The conductive adhesive member 140 is disposed to cover one end of the dam member 130 and the plurality of pads PE disposed on the pad area PA.

The plurality of flexible films 150 are disposed on the conductive adhesive member 140 and the seal member 160 is disposed on the plurality of flexible films 150. The seal member 160 is disposed so as to enclose the active area AA. The seal member 160 is disposed along the non-active area NA to enclose the active area AA. A planar shape of the seal member 160 is a frame shape. The seal member 160 is disposed so as to cover a side surface of the encapsulation unit 120 of the active area AA to minimize the permeation of the moisture and oxygen into the active area AA.

Referring to FIG. 4, in the plurality of second areas A2 in which the pad PE is not disposed, the seal member 160 is disposed so as to cover the bank 115, the planarization layer 114, and the dam member 130 disposed at the side surface and the outside of the encapsulation unit 120.

The seal member 160 may be formed of a non-conducting material having an elasticity so as to encapsulate the side surface of the active area AA and reinforce the rigidity of the side surface of the display device 100. Further, the seal member 160 may be formed of a material having an adhesiveness. The seal member 160 may further include an absorbent which absorbs moisture and oxygen from the outside to minimize the moisture permeation through the side portion of the display device 100. For example, the seal member 160 may be formed of polyimide (PI), poly urethane, epoxy, or acryl-based material, but is not limited thereto.

The seal member 160 may be formed of a material having a modulus of approximately 200 MPa. If the seal member 160 is formed of a material having a modulus of 200 MPa or lower, the pad area PA may be deformed to be bent or wrinkled.

Accordingly, the seal member 160 is formed of a material having a modulus of 200 MPa or higher to support an outer periphery of the display device 100 not to be deformed.

In the meantime, the dam member 130 may be formed of a material having a modulus higher than that of the seal member 160. The dam member 130 which supports the plurality of flexible films 150 bonded to the pad area PA is formed of a material having a high modulus to improve the rigidity of the pad area PA. For example, the dam member 130 may be formed of the same material as the bank 115, for example, polyimide and has a higher modulus than that of the seal member 160.

Even though not illustrated in the drawing, a polarizer and a barrier film may be disposed below the substrate 110. The polarizer selectively transmits light to reduce the reflection of external light which is incident onto the substrate 110. Specifically, in the display device 100, various metal materials which are applied to semiconductor devices, wiring lines, and light emitting diodes OLED are formed on the substrate 110. Therefore, the external light incident onto the substrate 110 may be reflected from the metal material so that the visibility of the display device 100 may be reduced due to the reflection of the external light. At this time, the polarizer which suppresses the reflection of external light is disposed below the substrate 110 to increase outdoor visibility of the display device 100. However, the polarizer may be omitted depending on an implementation example of the display device 100.

The barrier film minimizes the permeation of the moisture and oxygen outside the substrate 110 into the substrate 110 to protect the light emitting diode OLED of the active area AA. However, the barrier film may be omitted depending on an implementation example of the display device 100, but it is not limited thereto.

Hereinafter, a manufacturing method of a display device 100 according to an exemplary embodiment of the present disclosure will be described with reference to FIGS. 5A to 5G.

Figure 5A:
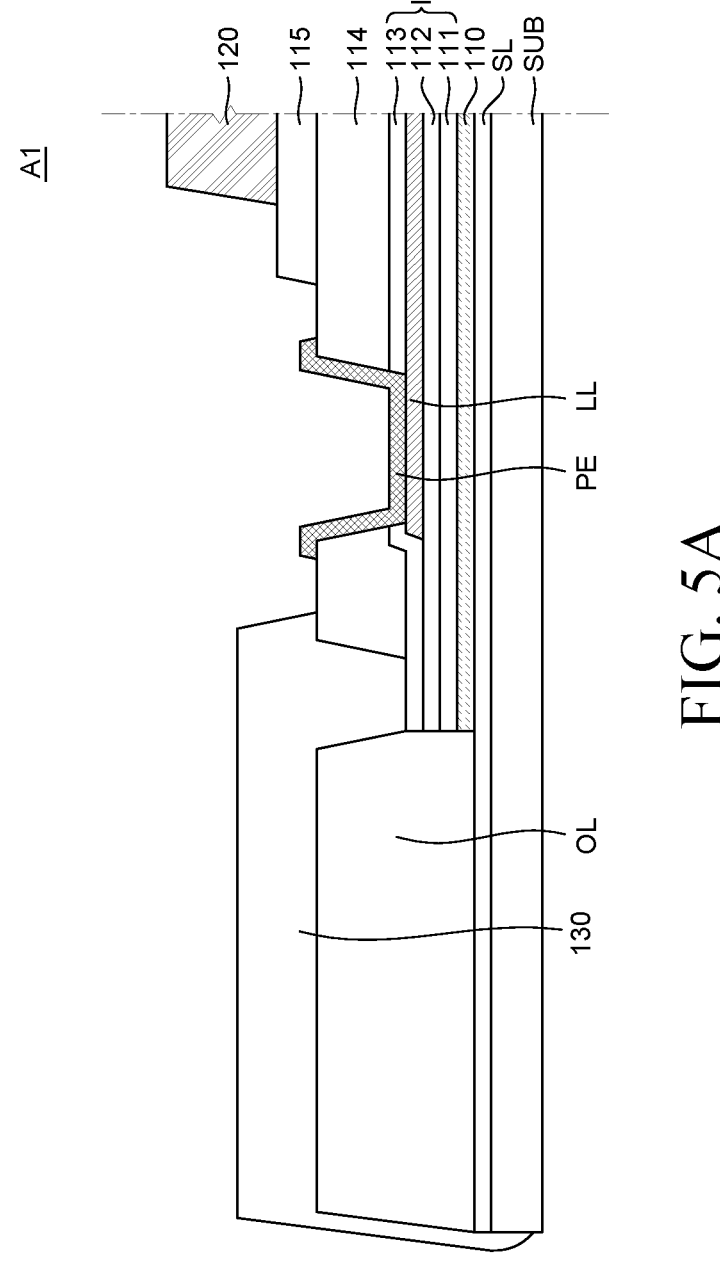
FIGS. 5A to 5G are process diagrams for explaining a method for manufacturing a display device according to an exemplary embodiment of the present disclosure.
Figure 5B:
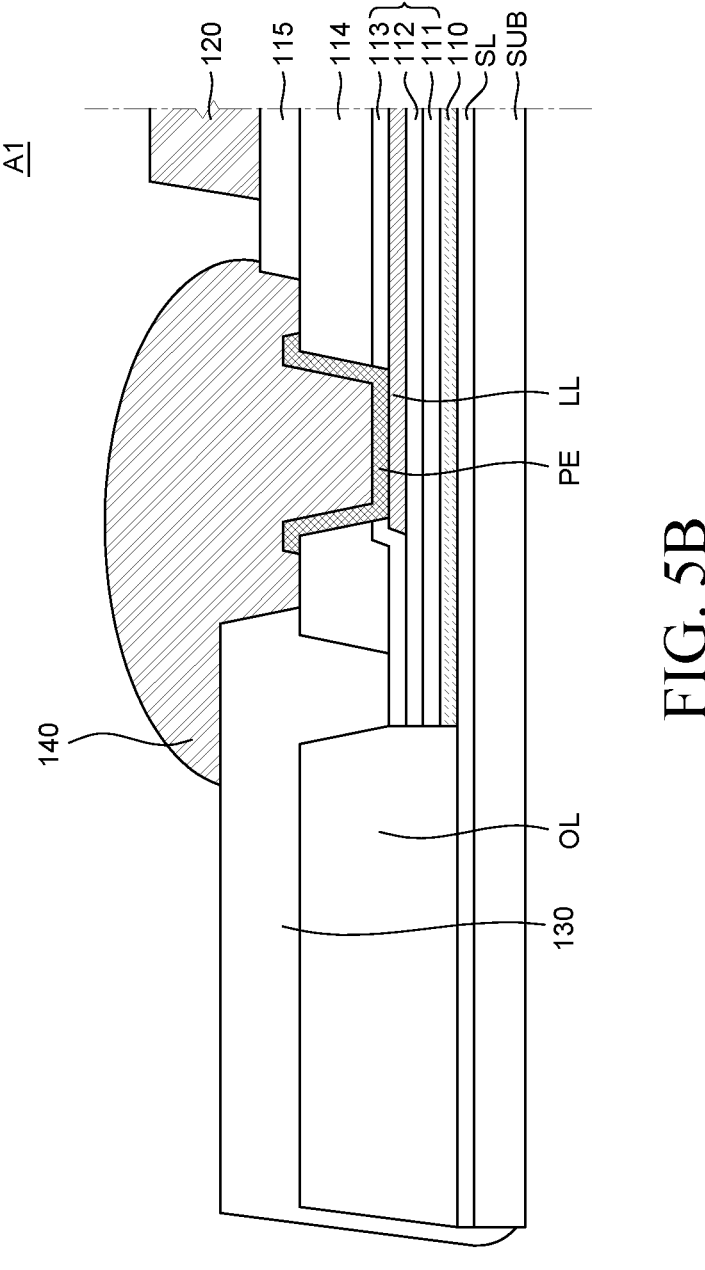
Figure 5C:
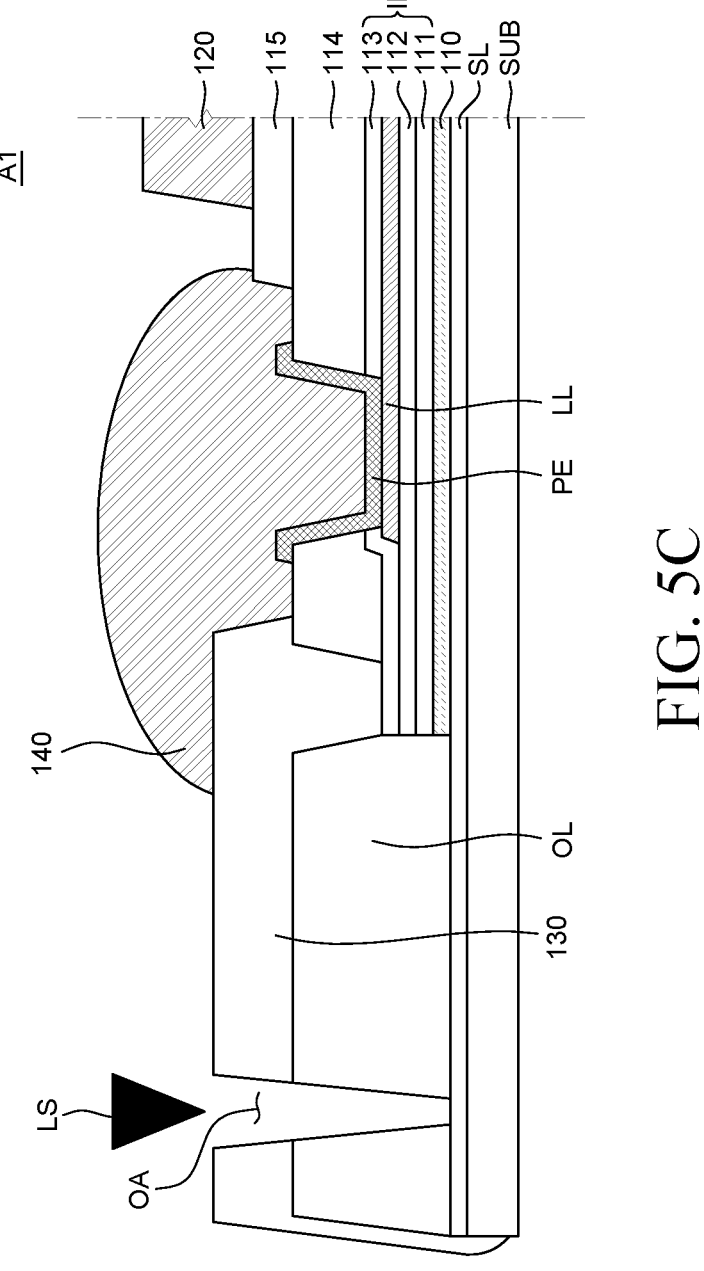
Figure 5D:
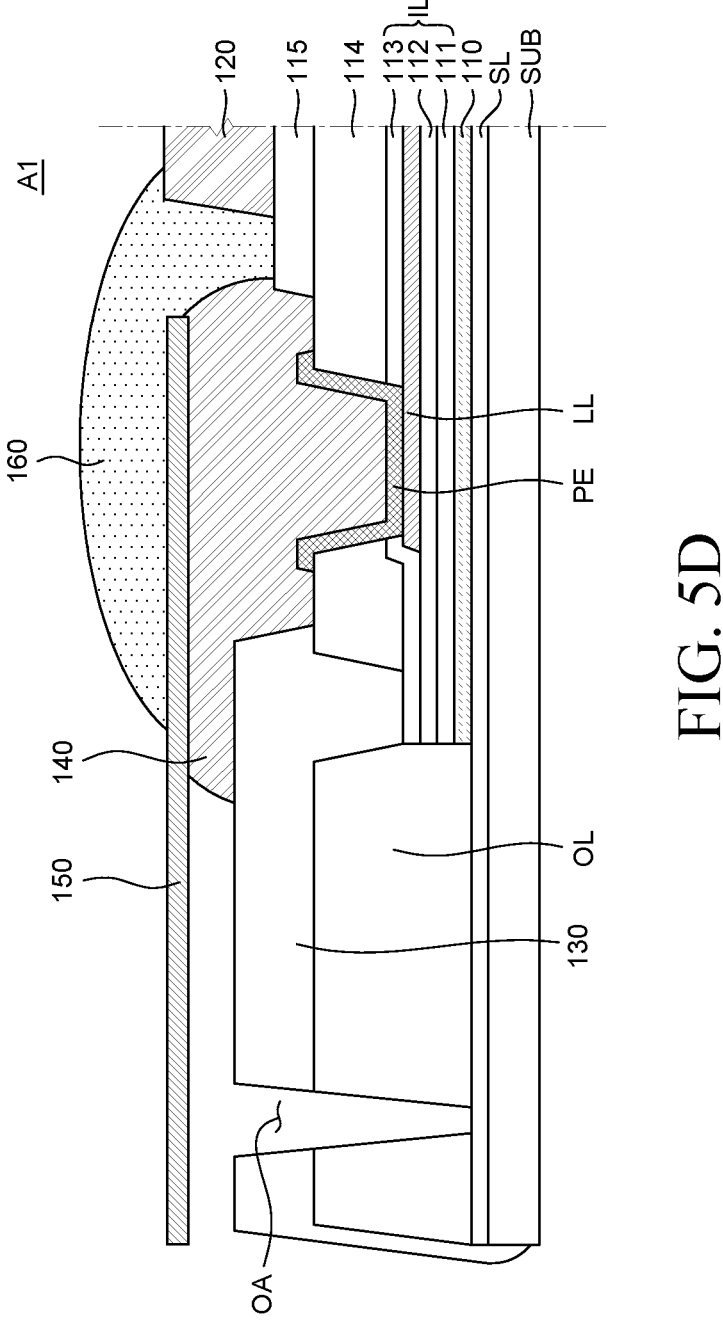
Figure 5E:
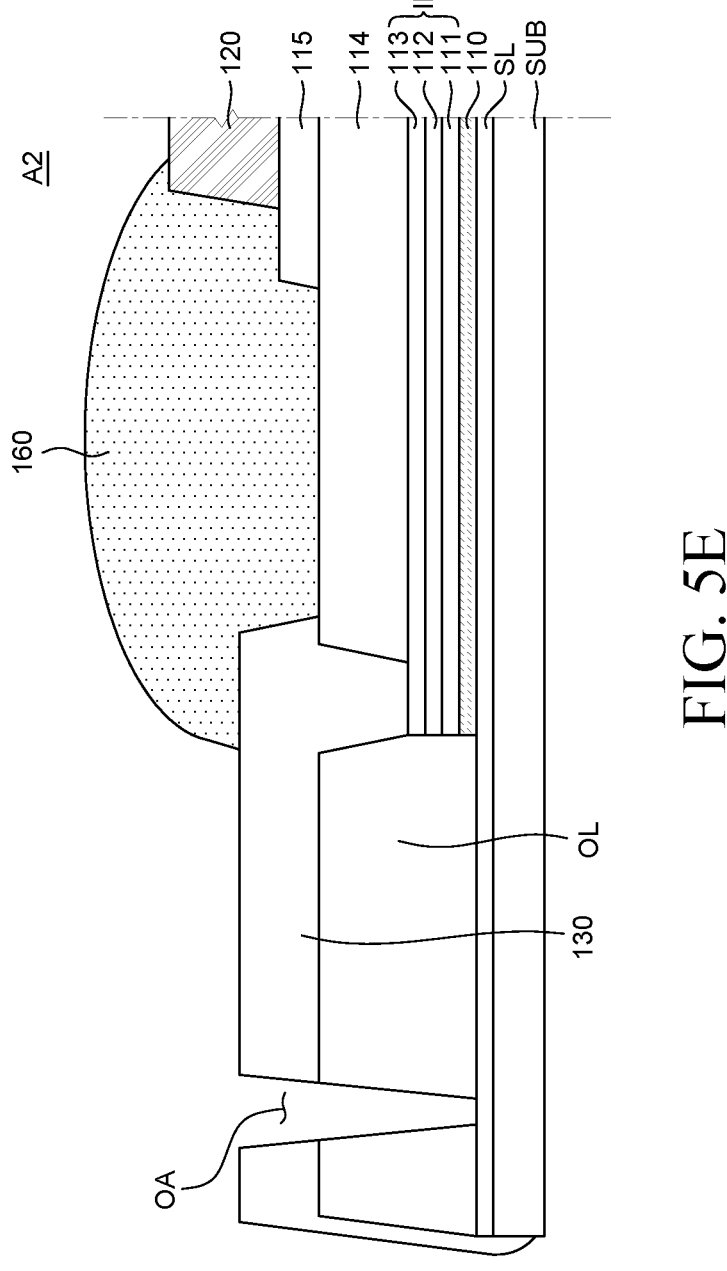
Figure 5F:
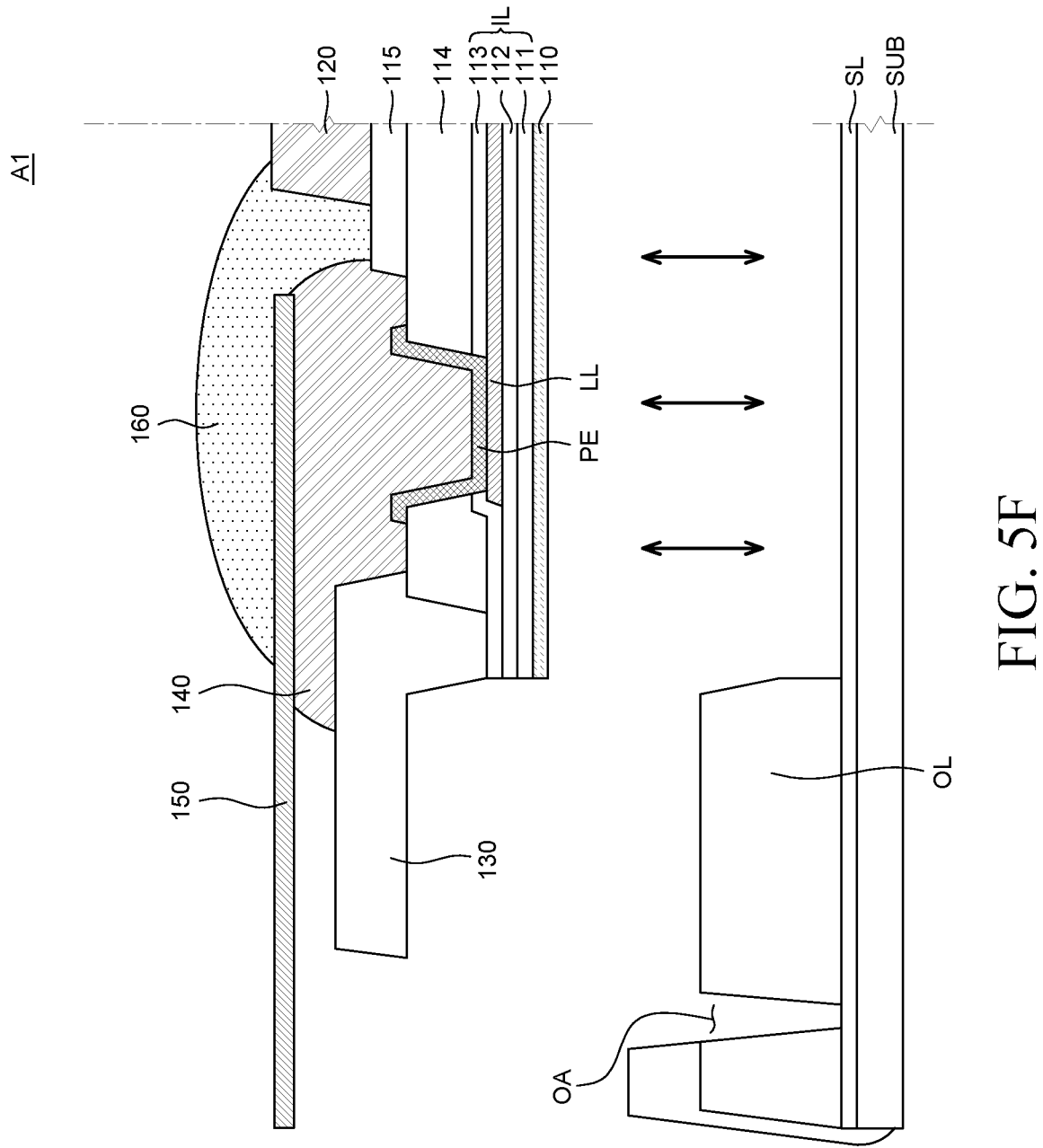
Figure 5G:
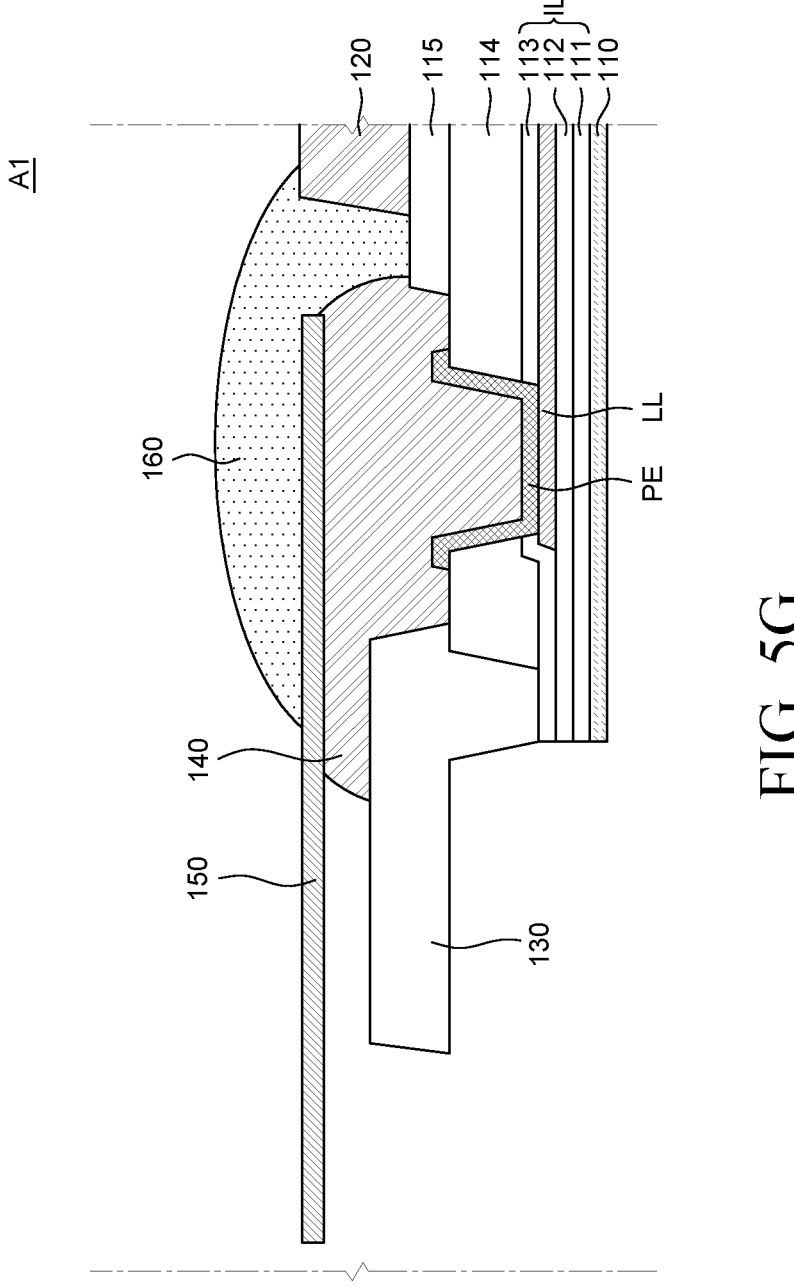

FIGS. 5A to 5G are process diagrams for explaining a method for manufacturing a display device according to an exemplary embodiment of the present disclosure. FIGS. 5A to 5C are process diagrams for explaining a process of forming a dam member 130 and a conductive adhesive member 140 and FIGS. 5D and 5E are process diagrams for explaining a process of bonding a plurality of flexible films 150 and a process of forming a seal member 160. FIGS. 5F and 5G are process diagrams for explaining an LLO process.

Referring to FIG. 5A, a temporary substrate SUB on which a sacrificial layer SL is formed is attached below the substrate 110 to perform the manufacturing process of the display device 100.

The temporary substrate SUB is a substrate which supports a substrate 110 and components disposed on the substrate 110 during the manufacturing process of the display device 100. The temporary substrate SUB may be formed of a material having a rigidity. For example, the temporary substrate SUB may be formed of glass, but is not limited thereto.

The sacrificial layer SL is a layer formed to easily separate the temporary substrate SUB and the substrate 110 from each other. Laser is irradiated onto the sacrificial layer SL from the lower portion of the temporary substrate SUB to dehydrogenate the sacrificial layer SL and separate the temporary substrate SUB and the sacrificial layer SL from the substrate 110. For example, the sacrificial layer SL may use a hydrogenated amorphous silicon or an amorphous silicon which is hydrogenated and doped with impurities.

At this time, the transparent conducting oxide and the oxide semiconductor are materials which may perform the LLO process with the sacrificial layer SL and the temporary substrate SUB. Therefore, even though the substrate 110 is formed of any one of the transparent conducting oxide or the oxide semiconductor, the substrate 110 may be easily separated from the temporary substrate SUB. Accordingly, in the display device 100 according to the exemplary embodiment of the present disclosure, the substrate 110 is configured by any one of the transparent conducting oxide or the oxide semiconductor which may perform the LLO process. Therefore, the display device 100 may be easily manufactured with the existing process and equipment.

Next, a plurality of inorganic insulating layers IL, a planarization layer 114, a bank 115, a transistor TR, a light emitting diode OLED, an encapsulation unit 120, a link line LL, and a plurality of pads PE are formed on the substrate 110 with the temporary substrate SUB attached thereto.

Next, a dam member 130 is formed on the temporary substrate SUB which protrudes outwardly from the substrate 110. At this time, after forming the substrate 110 or the plurality of inorganic insulating layers IL with the same size as the temporary substrate SUB, a part of the substrate 110 and the plurality of inorganic insulating layers IL adjacent to the plurality of pads PE is patterned. The organic insulating layer OL and the dam member 130 are formed on an area in which the substrate 110 and the plurality of inorganic insulating layers IL are patterned to form a structure illustrated in FIG. 5A. That is, in an area corresponding to an area in which the organic insulating layer OL and the dam member 130 are formed, the organic insulating layer OL and the dam member 130 may be formed in a state in which the substrate 110 and the plurality of inorganic insulating layers IL are patterned to expose the sacrificial layer SL. However, a temporary substrate SUB having a larger size than that of the substrate 110 is attached from the beginning to form the structure illustrated in FIG. 5A, but it is not limited thereto.

Next, the organic insulating layer OL and the dam member 130 are formed on the temporary substrate SUB. The organic insulating layer OL is a configuration which compensates for a step between the dam member 130 and the temporary substrate SUB while manufacturing the display device 100. The organic insulating layer OL may be formed of the same material as the planarization layer 114, and for example, may be formed by a single layer or a double layer of an acrylic organic material, but is not limited thereto.

The dam member 130 is formed on the organic insulting layer OL. The dam member 130 may be formed of the same material as the bank 115, for example, formed of polyimide, but is not limited thereto. However, even though the dam member 130 is formed of the same material as the bank 115, a thickness of the dam member 130 is formed to be larger than that of the bank 115 so that the dam member 130 may be formed by a process different from that of the bank 115.

A lower surface of the dam member 130 may be located to be higher than an upper surface of the substrate 110 by the organic insulating layer OL. The substrate 110 is disposed on the sacrificial layer SL and the dam member 130 is formed on the sacrificial layer SL and the organic insulating layer OL so that a lower surface of a part of the dam member 130 disposed at the outside of the substrate 110 may be disposed to be higher than the substrate 110.

Next, referring to FIG. 5B, the conductive adhesive member 140 is formed on the plurality of pads PE in the plurality of first areas A1 of the pad area PA. The conductive adhesive member 140 may be formed so as to fully cover at least the plurality of pads PE in the plurality of first areas A1. A part of the conductive adhesive member 140 may be formed to be disposed on the dam member 130. One end of the conductive adhesive member 140 is formed to be disposed at the outside of the seal member 160 to be formed later to suppress the seal member 160 from permeating below the conductive adhesive member 140, which will be described in detail below.

In the meantime, the conductive adhesive member 140 overflows outwardly from the substrate 110 to cover the plurality of inorganic insulating layers IL and an upper portion of the dam member 130 disposed in the plurality of first areas A1. Therefore, the conductive adhesive member 140 overflows and overlaps all the plurality of inorganic insulating layers IL in the plurality of first areas A1 and supports the plurality of inorganic insulating layers IL so as not to generate the crack defect in the plurality of inorganic insulating layers IL. If the conductive adhesive member 140 does not overflow, but is disposed only in the substrate 110, a part of the plurality of inorganic insulating layers IL which does not overlap the conductive adhesive member 140 in the plurality of first areas A1 does not have a configuration which supports the part of the plurality of inorganic insulating layers IL after separating the temporary substrate SUB. Therefore, the part of the plurality of inorganic insulating layers IL is highly likely to be cracked or torn. Therefore, the conductive adhesive member 140 overflows outwardly from the substrate 110 to support all the plurality of inorganic insulating layers IL formed in the plurality of first areas A1 and reduce the cracks.

In the meantime, the conductive adhesive member 140 overflows in a state in which the dam member 130 and the organic insulating layer OL are formed so that the substrate 110 and the temporary substrate SUB may be easily separated after completing the manufacturing of the display device 100. If the conductive adhesive member 140 overflows without having the dam member 130 and the organic insulating layer OL, the conductive adhesive member 140 may overflow to the upper portion or the side surface of the temporary substrate SUB. In this case, the conductive adhesive member 140 is attached to both the substrate 110 and the temporary substrate SUB so that it may be difficult to separate the substrate 110 and the temporary substrate SUB. Therefore, the organic insulating layer OL and the dam member 130 are formed above the temporary substrate SUB exposed from the substrate 110 to suppress the attachment of the conductive adhesive member 140 overflowing outwardly from the substrate 110 to the temporary substrate SUB.

Next, referring to FIG. 5C, the laser LS is irradiated onto the organic insulating layer OL and the dam member 130 to form an open area OA which separates the organic insulating layer OL and the dam member 130 into two parts. A size of the dam member 130 may be adjusted according to the position of the open area OA. For example, in order to reduce the size of the dam member 130, the open area OA may be formed to be adjacent to the substrate 110.

Further, the open area OA may allow the dam member 130 to be easily separated from the organic insulating layer OL and the temporary substrate SUB during the process of separating the temporary substrate SUB and the substrate 110 thereafter. If the open area OA is not formed, a size of the dam member 130 may be excessively increased and if the dam member 130 is formed to be in contact with the side surface of the temporary substrate SUB, it is difficult to separate the dam member 130 from the temporary substrate SUB. Next, the open area OA may be formed in the middle of the dam member 130 so as to adjust the size of the dam member 130 and easily separate the dam member 130 from the organic insulating layer OL and the temporary substrate SUB.

Next, referring to FIG. 5D, the plurality of flexible films 150 are bonded onto the plurality of pads PE. The plurality of flexible films 140 is bonded such that one end is disposed on the conductive adhesive member 140 and the other end is disposed at the outside of the substrate 110. At this time, the conductive adhesive member 140 may additionally overflow due to a pressure applied at the time of bonding the plurality of flexible films 150.

Referring to FIGS. 5D and 5E together, the seal member 160 is formed on the plurality of flexible films 150. The seal member 160 may be formed to cover a side surface of the encapsulation unit 120 and the plurality of flexible films 150 in the non-active area NA. A part of the seal member 160 overflows outwardly from the substrate 110 to be disposed on the dam member 130 and overlaps all the plurality of inorganic insulating layers IL disposed in the plurality of first areas A1 and the plurality of second areas A2. Both the seal member 160 and the conductive adhesive member 140 overflow outwardly from the substrate 110 to support all the plurality of inorganic insulating layers IL of the pad area PA and reduce the crack defect in the plurality of inorganic insulating layers IL.

At this time, the edge of the seal member 160 extends away from the encapsulation unit 120 less than the edge of the conductive adhesive member 140 extending away from the encapsulation unit 120. The edge of the conductive adhesive member 140 disposed on the dam member 130 may be disposed at the outside of the edge of the seal member 160. The conductive adhesive member 140 overflows outwardly from the substrate 110 more than the seal member 160 to suppress the seal member 160 from permeating a space below the plurality of flexible films 150 to be uncured. If the seal member 160 overflows more than the conductive adhesive member 140, the seal member 160 permeates the empty space between the plurality of flexible films 150 and the dam member 130 in which the conductive adhesive member 140 is not formed. The seal member 160 permeating the empty space below the plurality of flexible films 150 may not be cured. Therefore, the conductive adhesive member 140 may overflow outwardly from the substrate 110 more than the seal member 160 so that the seal member 160 does not permeate the empty space between the plurality of flexible films 150 and the dam member 130. Accordingly, the edge of the seal member 160 may be disposed inside from the edge of the conductive adhesive member 140.

Next, referring to FIGS. 5F and 5G, the substrate 110 and the temporary substrate SUB may be separated by the LLO process. The sacrificial layer SL may use hydrogenated amorphous silicon or hydrogenated amorphous silicon doped with impurities. When the laser is irradiated toward the temporary substrate SUB and the sacrificial layer SL from the lower portion of the temporary substrate SUB, the hydrogen of the sacrificial layer SL is dehydrogenated and the sacrificial layer SL and the temporary substrate SUB are separated from the substrate 110.

The dam member 130 which is attached to the plurality of flexible films 150 and the substrate 110 by means of the conductive adhesive member 140 may be separated from the organic insulating layer OL on the temporary substrate SUB in the LLO process.

At this time, the organic insulating layer OL is formed of a material having a high transmittance in a laser wavelength band used for the LLO process and the dam member 130 is formed of a material having a low transmittance in a laser wavelength band. For example, when a light wavelength of the laser used in the LLO process is approximately 308 nm to 343 nm, the organic insulating layer OL transmits light corresponding to the wavelength and the dam member 130 absorbs light corresponding to the wavelength. Therefore, during the LLO process, the laser is directed to the interface between the organic insulating layer OL which transmits the light and the dam member 130 which absorbs the light and the interface of the organic insulating layer OL and the dam member 130 may be easily separated. For example, the organic insulating layer OL is formed of an acrylic material which transmits light corresponding to the light wavelength of the laser and the dam member 130 which absorbs light corresponding to the light wavelength of the laser is formed of the polyimide-based material. Therefore, during the LLO process, the organic insulating layer OL and the dam member 130 are easily separated.

The dam member 130 is fixed to the plurality of flexible films 150 and the substrate 110 by means of the conductive adhesive member 140 and the seal member 160 and the organic insulating layer OL is formed on the temporary substrate SUB, but is not in contact with the conductive adhesive member 140 or the seal member 160. Therefore, during the process of separating the temporary substrate SUB and the substrate 110, the dam member 130 fixed to the substrate 110 may be separated from the organic insulating layer OL. In this case, the dam member 130 formed at the outside of the open area OA is not connected to the substrate 110 so that the dam member 130 may remain on the temporary substrate SUB as it is.

In the display device 100 according to the exemplary embodiment of the present disclosure and a manufacturing method thereof, the substrate 110 is formed of any one of a transparent conducting oxide and an oxide semiconductor to reduce a thickness of the display device 100. In the related art, the plastic substrate has been mainly used as the substrate of the display device. However, the plastic substrate is formed by coating and curing a substrate material at a high temperature so that there are problems in that it takes a long time and it is difficult to form the thickness to be equal to or lower than a predetermined level. In contrast, the transparent conducting oxide and the oxide semiconductor may be formed to have a very thin thickness by the deposition process such as sputtering. Therefore, in the display device 100 according to the exemplary embodiment of the present disclosure, a substrate 110 which supports various components of the display device 100 is configured by a transparent conducting oxide layer or the oxide semiconductor layer to reduce a thickness of the display device 100 and implement a slim design.

In the meantime, according to the related art, a flexible display device is formed by forming a light emitting diode and a driving circuit on a plastic substrate which is more flexible than the glass substrate. However, the display device is excessively deformed, the display device may be damaged due to a stress generated during the deformation. Accordingly, in order to improve the flexibility to relieve the stress of the display device, it is advantageous to reduce the thickness of the display device. However, as described above, it is difficult to form the plastic substrate to have a thickness which is equal to or smaller than a predetermined thickness.

Accordingly, in the display device 100 according to the exemplary embodiment of the present disclosure and the manufacturing method thereof, the substrate 110 is formed of a transparent conducting oxide or an oxide semiconductor to improve the flexibility of the display device 100 and reduce the stress generated when the display device 100 is deformed. Specifically, when the substrate 110 is configured by the transparent conducting oxide layer or the oxide semiconductor layer, the substrate 110 may be formed as a very thin film. In this case, the substrate 110 is also referred to as a transparent thin film layer. Accordingly, the display device 100 including a substrate 110 may have a high flexibility and the display device 100 may be easily bent or rolled. Therefore, in the display device 100 according to the exemplary embodiment of the present disclosure, the substrate 110 is formed by any one of the transparent conducting oxide layer and the oxide semiconductor layer to improve the flexibility of the display device 100. Accordingly, the stress generated when the display device 100 is deformed is also relieved so that the crack caused in the display device 100 may be minimized.

In the meantime, even though the conventional flexible display device is implemented using a plastic substrate, instead of the glass substrate, the plastic substrate is more likely to generate static electricity than the glass substrate. The static electricity affects various wiring lines and the driving element on the plastic substrate so that some components may be damaged or the display quality of the display device may be degraded. Accordingly, in the conventional display device in which the plastic substrate is used, a separate configuration for blocking and discharging the static elasticity is further necessary.

In the display device 100 according to the exemplary embodiment of the present disclosure and the manufacturing method thereof, the substrate 110 is formed of any one of a transparent conducting oxide layer and an oxide semiconductor layer to reduce the possibility of generating the static electricity in the substrate 110. If the substrate 110 is formed of plastic so that the static electricity is generated, various wiring lines and driving elements on the substrate 110 are damaged or the driving is affected due to the static electricity degrading the display quality. Instead, when the substrate 110 is formed of the transparent conducting oxide layer or the oxide semiconductor layer, the static electricity generated in the substrate 110 is minimized and a configuration for blocking and discharging the static electricity may be simplified. Accordingly, in the display device 100 according to the exemplary embodiment of the present disclosure, the substrate 110 is formed of any one of the transparent conducting oxide or the oxide semiconductor having a low possibility of generating the static electricity. By doing this, the damage or the display quality degradation due to the static electricity may be minimized.

In the meantime, when the plastic substrate is used as the substrate of the conventional display device, foreign materials may be generated during the process of forming the plastic substrate. For example, in order to form a plastic substrate, when a substrate material is coated and cured, the foreign materials may be generated. Due to the foreign materials, the moisture or oxygen may more easily permeate into the display device so that various configurations on the substrate may be non-uniformly formed due to the foreign materials. Accordingly, the light emitting diode in the display device may be deteriorated or the characteristic of the transistor may be degraded due to the foreign materials, in the plastic substrate formed by the coating and curing methods.

In contrast, in the display device 100 according to the exemplary embodiment of the present disclosure and the manufacturing method thereof, the substrate 110 is formed of one of the transparent conducting oxide and the oxide semiconductor to minimize the permeation of the moisture or oxygen of the outside into the display device 100 by means of the substrate 110. When the substrate 110 is formed of the transparent conducting oxide layer or the oxide semiconductor, the substrate 110 is formed in the vacuum environment so that the foreign material generation possibility is significantly low. Further, even though the foreign material is generated, the size of the foreign material is very small so that the permeation of the moisture and oxygen into the display device 100 may be minimized. Accordingly, in the display device 100 according to the exemplary embodiment of the present disclosure, the substrate 110 is formed of a transparent conducting oxide or the oxide semiconductor having a low possibility of generating the foreign material and an excellent moisture permeation performance. By doing this, the reliability of the light emitting diode OLED including an organic material and the display device 100 may be improved.

In the display device 100 according to the exemplary embodiment of the present disclosure and the manufacturing method thereof, the substrate 110 is formed of any one of a transparent conducting oxide and an oxide semiconductor to attach a barrier film which is thin and cheap below the substrate 110. When the substrate 110 is formed of a material having bad moisture permeation performance, for example, plastic, the moisture permeability may be supplemented by attaching a high performance barrier film. However, in the display device 100 according to the exemplary embodiment of the present disclosure, the substrate 110 is formed of a transparent conducting oxide or an oxide semiconductor having an excellent moisture permeation performance so that a thin and cheap barrier film may be attached below the substrate 110. Accordingly, in the display device 100 according to the exemplary embodiment of the present disclosure, the substrate 110 is configured by any one of the transparent conducting oxide or the oxide semiconductor having an excellent moisture permeation performance to reduce the manufacturing cost of the display device 100.

In the display device 100 according to the exemplary embodiment of the present disclosure and the manufacturing method thereof, the substrate 110 is formed of any one of a transparent conducting oxide and an oxide semiconductor to perform a laser lift off (LLO) process. When the display device 100 is manufactured, a temporary substrate SUB in which a sacrificial layer SL is formed is attached below the substrate 110 and then a configuration of the display device 100 is formed on the substrate 110. For example, the sacrificial layer SL may use a hydrogenated amorphous silicon or an amorphous silicon which is hydrogenated and doped with impurities. After completing the manufacturing of the display device 100, if the laser is irradiated from the lower portion of the temporary substrate SUB, hydrogen of the sacrificial layer SL is dehydrogenated and the sacrificial layer SL and the temporary substrate SUB are separated from the substrate 110. At this time, the transparent conducting oxide and the oxide semiconductor are materials which may perform the LLO process with the sacrificial layer SL and the temporary substrate SUB. Therefore, even though the substrate 110 is formed of any one of the transparent conducting oxide or the oxide semiconductor, the substrate 110 may be easily separated from the temporary substrate SUB. Accordingly, in the display device 100 according to the exemplary embodiment of the present disclosure, the substrate 110 is configured by any one of the transparent conducting oxide layer or the oxide semiconductor layer which may perform the LLO process. Therefore, the display device 100 may be easily manufactured with the existing process and equipment.

In the meantime, in order to reduce the crack defect of the plurality of inorganic insulating layers in the pad area, the crack defect of the plurality of inorganic insulating layer in the pad area may be reduced by overflowing the conductive adhesive member and the seal member without having a separate organic insulating layer or dam member. However, the conductive adhesive member and the seal member which overflow outwardly from the substrate are in contact with the temporary substrate to cause the LLO process defect of the substrate and the temporary substrate. Further, the seal member permeates below the flexible film to cause an un-curing defect.

Therefore, the substrate may be formed to extend longer than the conductive adhesive member and the seal member which overflow to ensure an available space in which the conductive adhesive member and the seal member are seated. However, after separating the substrate from the temporary substrate, there is no configuration which supports a part of the substrate extending to the outside of the conductive adhesive member and the seal member so that there may be defects in that the substrate is damaged and scatters.

An organic insulating layer which covers a part of the substrate extends to the outside of the conductive adhesive member and the seal member so that the part of the substrate does not scatter. However, during the LLO process which separates the substrate and the temporary substrate, there are problems in that the organic insulating layer and the substrate are separated and the substrate is vulnerable to the pressure.

Accordingly, in the display device 100 according to the exemplary embodiment of the present disclosure and the manufacturing method thereof, in a state in which a part of the substrate 110 extends from the outside of the conductive adhesive member 130 and the seal member 160 to be exposed from the conductive adhesive member 130 and the seal member 160, the organic insulating layer OL and the dam member 130 which cover the edge of the substrate 110 are formed and a subsequent process is performed. Therefore, the scattering of the substrate 110 in the LLO process may be minimized. Specifically, referring to FIG. 5A, the substrate 110 extending to the outside of the conductive adhesive member 130 and the seal member 160 is removed and the organic insulating layer OL and the dam member 130 may be formed above the temporary substrate SUB exposed by removing the substrate 110. Therefore, the conductive adhesive member 140 and the seal member 160 or a part of the substrate 110 exposed from the dam member 130 is removed to block the possibility of cracking and scattering the substrate 110. Further, the conductive adhesive member 130 and the seal member 160 overflow to the outside of the substrate 110 to cover all the edge portion of the substrate 110 so that the substrate 110 may be supported in a state in which the temporary substrate SUB is separated. According to the display device 100 according to the exemplary embodiment of the present disclosure and the manufacturing method thereof, the process is performed in a state in which the conductive adhesive member 140 and the seal member 160 and a part of the substrate 110 exposed from the dam member 130 are removed. By doing this, the scattering of the substrate 110 may be suppressed.

In the display device 100 according to the exemplary embodiment of the present disclosure and the manufacturing method thereof, the conductive adhesive member 140 and the seal member 160 overflow outwardly from the substrate 110 to support the plurality of inorganic insulating layers IL on the pad area PA and reduce the crack in the pad area PA. If the conductive adhesive member 140 is formed only in a partial area of the plurality of first areas A1 corresponding to the plurality of pads PE, the plurality of pads PE and the plurality of flexible films 150 may be electrically connected. However, when the conductive adhesive member 140 does not overflow so that in a part of the first area A1, the conductive adhesive member 140 is not disposed, there is no configuration which supports a part of the first area A1 after separating the temporary substrate SUB and the substrate 110. Accordingly, the crack or tearing defects may be generated in the plurality of inorganic insulating layers IL. Similar to this, when the seal member 160 does not cover all the plurality of second areas A2 of the pad area PA, there is no configuration which supports a part of the pad area PA exposed from the seal member 160 so that the defects such as cracks may be generated. Accordingly, in the display device 100 according to the exemplary embodiment of the present disclosure and the manufacturing method thereof, the conductive adhesive member 140 and the seal member 160 overflow to the outside of the substrate 110 to cover and support all the plurality of inorganic insulating layers IL disposed on the pad area PA. At this time, the dam member 130 supports the conductive adhesive member 140 and the seal member 160 overflowing outwardly from the substrate 110 so that the conductive adhesive member 140 and the seal member 160 support the pad area PA after separating the temporary substrate SUB. Specifically, the crack generated in the plurality of inorganic insulating layers IL may be reduced.

The display device 100 according to the exemplary embodiment of the present disclosure and the manufacturing method thereof form the organic insulating layer OL and the dam member 130 to the outside of the substrate 110 from the edge of the substrate 110. Therefore, the conductive adhesive member 140 and the seal member 160 which overflow to the outside of the substrate 110 may be supported and the temporary substrate SUB and the substrate 110 may be easily separated. In order to reduce the crack of the plurality of inorganic insulating layers IL in the pad area PA, the conductive adhesive member 140 and the seal member 160 may overflow outwardly from the substrate 110 so as to fully cover the pad area PA. At this time, the conductive adhesive member 140 and the seal member 160 which overflow outwardly from the substrate 110 could be in contact with the temporary substrate SUB so that there may be a defect of an LLO process of the temporary substrate SUB and the substrate 110 if the dam member 130 and the organic insulating layer OL are not formed. Accordingly, the organic insulating layer OL and the dam member 130 are formed on the temporary substrate SUB which is exposed from the substrate 110 to separate the conductive adhesive member 140 and the seal member 160 which overflow from the substrate 110 and easily separate the substrate 110 from the temporary substrate SUB.

In the display device 100 according to the exemplary embodiment of the present disclosure and the manufacturing method thereof, the conductive adhesive member 140 overflows outwardly from the substrate 110 more than the seal member 160 to minimize the defect that the seal member 160 permeates below the plurality of flexible films 150 to be uncured. If the seal member 160 overflows more than the conductive adhesive member 140, the seal member 160 may permeate the space between the plurality of flexible films 150 and the dam member 130 which is not filled with the conductive adhesive member 140. According to the method of irradiating the UV to cure the seal member 160, it is difficult to irradiate the UV light to the lower portion of the plurality of flexible films 150 and the seal member 160 permeating the lower portion of the plurality of flexible films 150 may not be cured. Accordingly, in the display device 100 according to the exemplary embodiment of the present disclosure and the manufacturing method thereof, the conductive adhesive member 140 overflows outwardly from the substrate 110 more than the seal member 160 to suppress the permeation of the seal member 160 into the empty space between the plurality of flexible films 150 and the dam member 130 and minimize the un-curing defect of the seal member 160.

Figure 6:
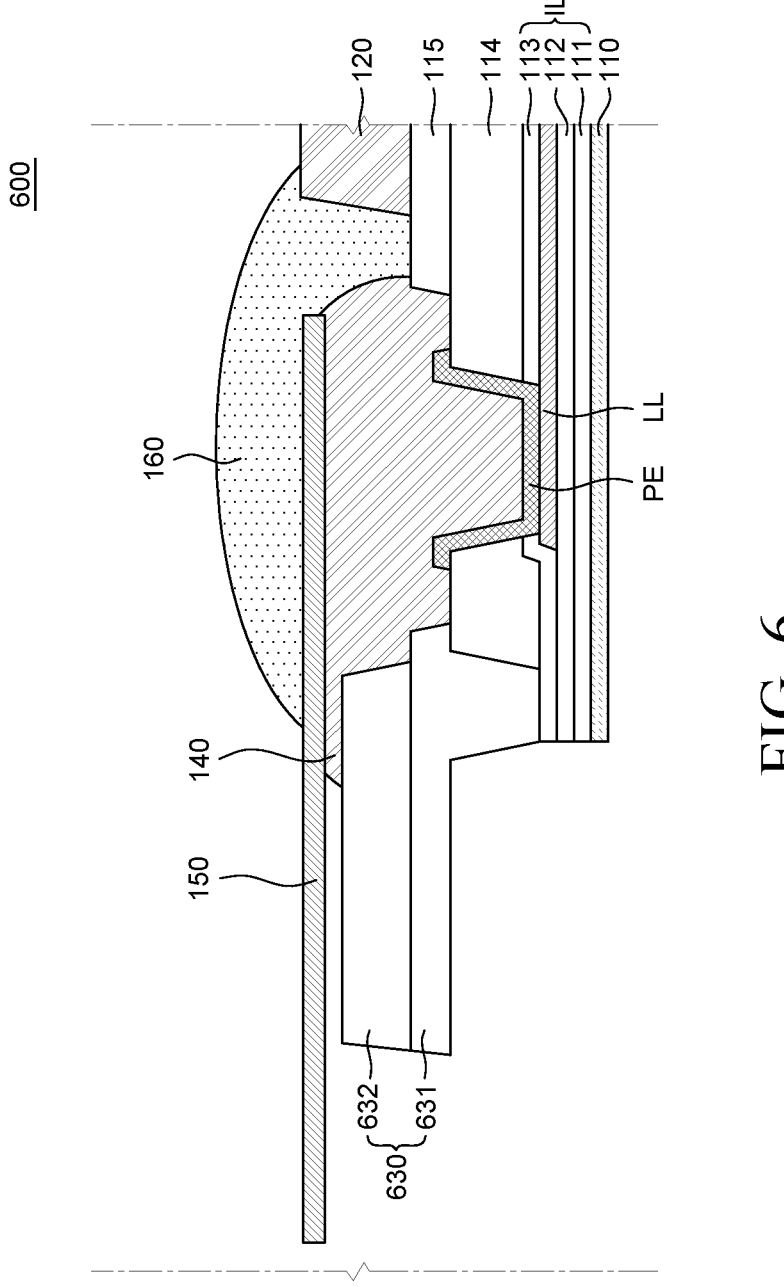
FIG. 6 is a cross-sectional view of a display device according to another exemplary embodiment of the present disclosure.

FIG. 6 is a cross-sectional view of a display device according to another exemplary embodiment of the present disclosure. The only difference between the display device 600 of FIG. 6 and the display device 100 of FIGS. 1 to 4 is that the dam member 630 is formed of a first dam 631 and a second dam 632, but other configurations are substantially the same, so that a redundant description will be omitted.

Referring to FIG. 6, the dam member 630 including the first dam 631 and the second dam 632 is disposed below the plurality of flexible films 150. One ends of the first dam 631 and the second dam 632 of the dam member 630 are disposed on the pad area PA and the other ends are disposed at the outside of the substrate 110.

The first dam 631 may be formed of the same material by the same process as the bank 115. For example, in a state in which the planarization layer 114 and the organic insulating layer OL are formed on the temporary substrate SUB and the substrate 110, the first dam 631 and the bank 115 are formed by the same process. Accordingly, the first dam 631 and the bank 115 are formed of the same material and an upper surface of the first dam 631 may be disposed on the same plane as the upper surface of the bank 115. Accordingly, the first dam 631 is formed by the same process as the bank 115 so that the forming process of the first dam 631 may be simplified.

The second dam 632 is disposed on the first dam 631. The second dam 632 may relieve the step between the first dam 631 and the plurality of flexible films 150. When the first dam 631 is formed by the same process as the bank 115, it is difficult to form the large thickness. In this case, the second dam 632 is additionally formed on the first dam 631 to compensate for the step between the first dam 631 and the flexible films 150 so that the dam member 630 easily supports the plurality of flexible films 150.

At this time, the second dam 632 is formed of a material different from that of the first dam 631. For example, the second dam 632 may be formed of an organic material such as acryl resin, epoxy resin, phenolic resin, or polysiloxane, but is not limited thereto. A curing process is additionally performed to form the second dam 632 depending on the type of the organic material, but it is not limited thereto.

In the display device 600 according to another exemplary embodiment of the present disclosure, the dam member 630 including the first dam 631 and the second dam 632 are formed below the plurality of flexible films 150 to support the plurality of flexible films 150. The dam member 630 supports the conductive adhesive member 140 and the seal member 160 which overflow outwardly from the substrate 110. The first dam 631 is formed by the same process as the bank 115 so that an upper surface is disposed on the same plane as the upper surface of the bank 115. However, when the first dam 631 is formed by the same process as the bank 115, the thickness of the first dam 631 is not formed to be larger than that of the bank 115 so that an empty space between the first dam 631 and the plurality of flexible films 150 may be increased. Therefore, the second dam 632 is additionally formed on the first dam 631 to minimize the space between the plurality of flexible films 150 and the second dam 632. Accordingly, in the display device 600 according to still another exemplary embodiment of the present disclosure, the second dam 632 is additionally formed on the first dam 631 formed by the same process as the bank 115 to supplement the step between the first dam 631 and the plurality of flexible films 150. Further, the plurality of flexible films 150 and the conductive adhesive member 140 and the seal member 160 which overflow outwardly from the substrate 110 may be easily supported.

Figure 7:
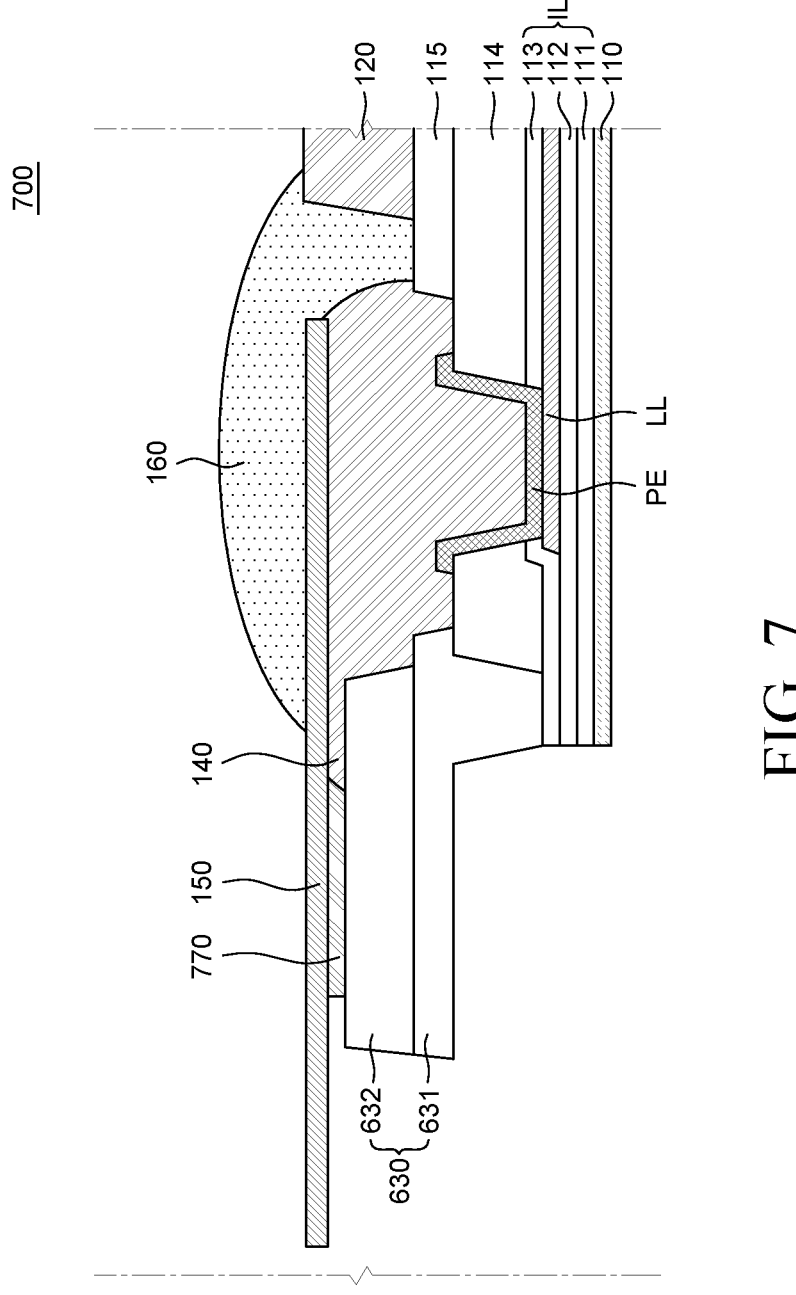
FIG. 7 is a cross-sectional view of a display device according to still another exemplary embodiment of the present disclosure.

FIG. 7 is a cross-sectional view of a display device according to still another exemplary embodiment of the present disclosure. As compared with the display device 100 of FIG. 6, a display device 700 of FIG. 7 further includes a tape 770, but the other configurations are substantially the same, so that a redundant description will be omitted.

Referring to FIG. 7, a tape 770 is formed between the second dam 632 of the dam member 630 and the plurality of flexible films 150. The tape 770 is formed at the outside of the conductive adhesive member 140 on an upper surface of the second dam 632. The conductive adhesive member 140 overflows to a space formed by a side surface of the tape 770, an upper surface of the second dam 632, and a lower portion of the plurality of flexible films 150 and an edge of the conductive adhesive member 140 is in contact with the tape 770. Accordingly, the empty space between the plurality of flexible films 150 and the dam member 630 is filled with the tape 770 and the conductive adhesive member 140 which overflows to be in contact with the tape 770.

Accordingly, in the display device 700 according to another exemplary embodiment of the present disclosure, the tape 770 is disposed between the plurality of flexible films 150 and the dam member 630 to minimize the permeation of the seal member 160 below the plurality of flexible films 150. Further, the tape 770 may fix and support the second dam 632 and the plurality of flexible films 150. If the seal member 160 overflows outwardly from the conductive adhesive member 140, the seal member 160 may permeate into a space between the plurality of flexible films 150 and the second dam 632 which is not filled with the conductive adhesive member 140. In this case, the seal member 160 which permeates below the plurality of flexible films 150 may be uncured. However, the empty space between the plurality of flexible films 150 and the second dam 632 is minimized by the tape 770 attached to the plurality of flexible films 150 and the dam member 630 and the conductive adhesive member 140 overflowing to the edge of the tape 770. Therefore, the permeation of the seal member 160 below the plurality of flexible films 150 may be minimized. Accordingly, in the display device 700 according to still another exemplary embodiment of the present disclosure, the tape 770 is additionally formed in the empty space between the plurality of flexible films 150 and the dam member 630 to minimize the defect that the seal member 160 permeates below the plurality of flexible films 150 to be uncured.

The exemplary embodiments of the present disclosure can also be described as follows:

According to an aspect of the present disclosure, there is provided a display device. The display device includes a substrate which includes an active area and a non-active area extending from the active area and including a pad area and is formed of any one of a transparent conducting oxide and an oxide semiconductor, a plurality of inorganic insulating layers disposed on the substrate, a dam member having one end disposed on the pad area and the other end disposed at the outside of the substrate, and a plurality of flexible films which are disposed to cover the dam member and has one end disposed in the pad area.

The display device may further include a plurality of pads which are disposed between the dam member and the active area in the pad area, and a plurality of conductive adhesive members which are disposed between the plurality of pads and the plurality of flexible films. Edges of the plurality of conductive adhesive members may be disposed on the dam member at the outside of the substrate.

The display device may further include a seal member which covers the pad area on the plurality of flexible films. The plurality of conductive adhesive members and the seal member may be partially disposed at the outside of the substrate to cover the dam member.

An edge of the seal member disposed on the dam member may be disposed to be closer to the inside of the substrate than edges of the plurality of conductive adhesive members.

The dam member may include a first dam having one end disposed on the pad area, and a second dam which has one end disposed on the pad area and is disposed on the first dam, and the first dam may be formed of a different material from the second dam.

The plurality of conductive adhesive members may cover one end of the first dam and the second dam.

The display device may further include a plurality of tapes which are disposed between the second dam and each of the plurality of flexible films.

A lower surface of the dam member may be disposed to be higher than an upper surface of the substrate.

The display device may further include a light emitting diode which is disposed on the plurality of inorganic insulating layers in the active area and includes an anode, a light emitting layer, and a cathode, and a bank disposed between the anode and the light emitting layer, in the active area. At least a part of the dam member may be formed of the same material as the bank.

According to another aspect of the present disclosure, there is provided a display device. The display device includes a substrate which includes a plurality of first areas in which a plurality of pads are disposed and a plurality of second areas between the plurality of first areas, and is formed of any one of a transparent conducting oxide and an oxide semiconductor, a plurality of inorganic insulating layers disposed between the substrate and the plurality of pads, a dam member which covers an edge of the substrate in the plurality of first areas and the plurality of second areas, a plurality of flexible films which are disposed on the dam member and are electrically connected to the plurality of pads, and a plurality of conductive adhesive members which are disposed between the plurality of pads and the plurality of flexible films. A part of the dam member is disposed on the substrate and the remaining part of the dam member is disposed at the outside of the substrate.

The display device may further include a seal member which covers the plurality of first areas and the plurality of second areas on the plurality of flexible films. The seal member may cover the plurality of inorganic insulating layers in the plurality of second areas.

Edges of the plurality of conductive adhesive members may be disposed at the outside of the edge of the seal member.

The display device may further include a bank disposed on the substrate, and a planarization layer disposed between the bank and the plurality of inorganic insulating layers. A part of a lower surface of the dam member disposed at the outside of the substrate may be disposed to be higher than the substrate.

The dam member may be formed of the same material as the bank, and a thickness of a part of the dam member disposed at the outside of the substrate may be larger than a thickness of the bank.

The dam member may include a first dam which is formed of the same material as the bank, and a second dam which is disposed on the first dam and is formed of a different material from the first dam.

A thickness of a part of the first dam disposed at the outside of the substrate may be equal to a thickness of the bank.

The display device may further include a plurality of tapes which are attached between the second dam and each of the plurality of flexible films.

In still another embodiment of the present disclosure, a display device comprises a substrate formed of either a transparent conducting oxide or an oxide semiconductor, the substrate including an active area and a non-active area extending from the active area and including a pad area; a plurality of inorganic insulating layers disposed on the substrate; a plurality of flexible films disposed in the pad area; a plurality of pads disposed in the pad area; a plurality of conductive adhesive members disposed between the plurality of pads and the plurality of flexible films; and a dam member including at least a first part and a second part, the first part disposed on and extending in a first direction away from at least one of the inorganic insulating layers in the pad area, and the second part extending away from the first part and the pads in a second direction intersecting the first direction.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate which includes an active area and a non-active area extending from the active area and including a pad area, the substrate formed of either a transparent conducting oxide or an oxide semiconductor;
   a plurality of inorganic insulating layers disposed on the substrate;
   a dam member having a first end disposed on the pad area and a second end disposed beyond an end of the substrate; and
   a plurality of flexible films covering the dam member a first end of the flexible films disposed in the pad area,
   wherein a part of a lower surface of the dam member is in contact with the plurality of inorganic insulating layers, and a remaining part of the lower surface of the dam member is exposed from the plurality of inorganic insulating layers and the substrate.

2. The display device according to claim 1, further comprising:
   a plurality of pads disposed between the dam member and the active area in the pad area; and
   a plurality of conductive adhesive members disposed between the plurality of pads and the plurality of flexible films,
   wherein first edges of the plurality of conductive adhesive members are disposed on the dam member beyond the end of the substrate.

3. The display device according to claim 2, further comprising:

a seal member which covers the pad area on the plurality of flexible films, wherein the plurality of conductive adhesive members and the seal member are partially disposed beyond the end of the substrate to cover the dam member.

4. The display device according to claim 3, wherein an edge of the seal member disposed on the dam member is disposed to be closer to inside of the substrate than the first edges of the plurality of conductive adhesive members.

5. The display device according to claim 2, wherein the dam member includes:

a first dam having a first end disposed on the pad area; and a second dam which has a first end disposed on the pad area and is disposed on the first dam, and wherein the first dam is formed of a different material from the second dam.

6. The display device according to claim 5, wherein the plurality of conductive adhesive members cover the first ends of the first dam and the second dam.

7. The display device according to claim 5, further comprising:

a plurality of tapes which are disposed between the second dam and each of the plurality of flexible films.

8. The display device according to claim 1, wherein a lower surface of the dam member is disposed to be higher than an upper surface of the substrate.

9. The display device according to claim 1, further comprising:

a light emitting diode which is disposed on the plurality of inorganic insulating layers in the active area and includes an anode, a light emitting layer, and a cathode; and a bank disposed between the anode and the light emitting layer, in the active area, wherein at least a part of the dam member is formed of the same material as the bank.

10. A display device, comprising:

a substrate which includes a plurality of first areas in which a plurality of pads are disposed and a plurality of second areas between the plurality of first areas, the substrate formed of either a transparent conducting oxide or an oxide semiconductor;

a plurality of inorganic insulating layers disposed between the substrate and the plurality of pads;

a dam member which covers a first edge of the substrate in the plurality of first areas and the plurality of second areas;

a plurality of flexible films which is disposed on the dam member and is electrically connected to the plurality of pads; and a plurality of conductive adhesive members which are disposed between the plurality of pads and the plurality of flexible films, wherein a part of the dam member is disposed on the substrate and a remaining part of the dam member is disposed beyond a first end of the substrate, wherein a part of a lower surface of the dam member is in contact with the plurality of inorganic insulating layers, and a remaining part of the lower surface of the dam member is exposed from the plurality of inorganic insulating layers and the substrate.

11. The display device according to claim 10, further comprising:

a seal member on the plurality of flexible films in the plurality of first areas and the plurality of second areas, wherein the seal member covers the plurality of inorganic insulating layers in the plurality of second areas.

12. The display device according to claim 11, wherein first edges of the plurality of conductive adhesive members are disposed beyond a first edge of the seal member away from the first end of the substrate.

13. The display device according to claim 10, further comprising:

a bank disposed on the substrate; and a planarization layer disposed between the bank and the plurality of inorganic insulating layers, wherein a part of a lower surface of the dam member disposed beyond the first end of the substrate is disposed to be higher than the substrate.

14. The display device according to claim 13, wherein the dam member is formed of the same material as the bank, and a thickness of a part of the dam member disposed beyond the first end of the substrate is greater than a thickness of the bank.

15. The display device according to claim 13, wherein the dam member includes:

a first dam which is formed of the same material as the bank; and a second dam which is disposed on the first dam and is formed of a different material from the first dam.

16. The display device according to claim 15, wherein a thickness of a part of the first dam beyond the first end of the substrate is equal to a thickness of the bank.

17. The display device according to claim 15, further comprising:

a plurality of tapes which are attached between the second dam and each of the plurality of flexible films.

18. A display device, comprising:

a substrate formed of either a transparent conducting oxide or an oxide semiconductor, the substrate including an active area and a non-active area extending from the active area and including a pad area;

a plurality of inorganic insulating layers disposed on the substrate;

a plurality of flexible films disposed in the pad area;

a plurality of pads disposed in the pad area;

a plurality of conductive adhesive members disposed between the plurality of pads and the plurality of flexible films; and a dam member including at least a first part and a second part, the first part disposed on and extending in a first direction away from at least one of the inorganic insulating layers in the pad area, and the second part extending away from the first part and the pads in a second direction intersecting the first direction, wherein a part of a lower surface of the dam member is in contact with the plurality of inorganic insulating layers, and a remaining part of the lower surface of the dam member is exposed from the plurality of inorganic insulating layers and the substrate.

19. The display device according to claim 18, wherein the conductive adhesive members are disposed on the dam member.

20. The display device according to claim 18, wherein the dam member includes:

a first dam; and a second dam disposed on the first dam, wherein the first dam is formed of a different material from the second dam.

21. The display device according to claim 18, further comprising:

a tape disposed between the dam member and a corresponding one of the plurality of flexible films.

22. The display device according to claim 18, wherein a lower surface of the second part of the dam member is disposed to be higher than an upper surface of the substrate.

23. The display device according to claim 18, further comprising:

a seal member which covers the pad area on the plurality of flexible films, the seal member extending in the second direction less than the second part of the dam member.

* * * * *